(12) United States Patent
Nambu et al.

(10) Patent No.: US 11,031,919 B2
(45) Date of Patent: Jun. 8, 2021

(54) ELASTIC WAVE DEVICE, DUPLEXER, AND COMMUNICATION DEVICE

(71) Applicant: KYOCERA Corporation, Kyoto (JP)

(72) Inventors: Masaki Nambu, Katano (JP); Hiroyuki Tanaka, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/493,183

(22) PCT Filed: Mar. 30, 2018

(86) PCT No.: PCT/JP2018/013707
§ 371 (c)(1),
(2) Date: Sep. 11, 2019

(87) PCT Pub. No.: WO2018/181932
PCT Pub. Date: Oct. 4, 2018

(65) Prior Publication Data
US 2020/0014365 A1    Jan. 9, 2020

(30) Foreign Application Priority Data

Mar. 31, 2017 (JP) .............................. JP2017-071558

(51) Int. Cl.
*H03H 9/10* (2006.01)
*H03H 9/25* (2006.01)
(Continued)

(52) U.S. Cl.
CPC ...... *H03H 9/1092* (2013.01); *H03H 9/02905* (2013.01); *H03H 9/14541* (2013.01);
(Continued)

(58) Field of Classification Search
CPC .. H03H 9/14541; H03H 9/02905; H03H 9/25; H03H 9/6483; H03H 9/725; H03H 9/1071; H03H 9/0576; H03H 9/1092
(Continued)

(56) References Cited

U.S. PATENT DOCUMENTS 6,400,172 B1    6/2002   Akram et al.
2009/0201102 A1*  8/2009   Oda ................... H03H 9/02834
                                                  333/193

(Continued)

FOREIGN PATENT DOCUMENTS

JP    2009-225118 A    10/2009
JP    2010-056671 A     3/2010
(Continued)

*Primary Examiner* — Rakesh B Patel
*Assistant Examiner* — Jorge L Salazar, Jr.
(74) *Attorney, Agent, or Firm* — Procopio Cory Hargreaves and Savitch LLP

(57) ABSTRACT

A surface acoustic wave (SAW) device includes a piezoelectric substrate, an interdigital transducer (IDT) electrode located on an upper surface of the piezoelectric substrate, a cover covering the upper surface of the piezoelectric substrate from above the IDT electrode, at least one first via conductor extending through at least part of the cover from the upper surface of the piezoelectric substrate to an upper surface of the cover, at least one second via conductor located, on the piezoelectric substrate, inward from the first via conductor in a plan view, extending through at least part of the cover from the upper surface of the piezoelectric substrate to the upper surface of the cover, and having a smaller diameter than the first via conductor, and a conductive layer located on the upper surface of the cover and extending over an upper end of the second via conductor.

12 Claims, 10 Drawing Sheets

(51) Int. Cl.
  *H03H 9/02*    (2006.01)
  *H03H 9/145*   (2006.01)
  *H03H 9/64*    (2006.01)
  *H03H 9/72*    (2006.01)

(52) U.S. Cl.
  CPC ............ *H03H 9/25* (2013.01); *H03H 9/6483* (2013.01); *H03H 9/725* (2013.01)

(58) Field of Classification Search
  USPC .................... 333/133, 187, 188, 193–196
  See application file for complete search history.

(56) References Cited

U.S. PATENT DOCUMENTS

| | | |
|---|---|---|
| 2010/0052473 A1 | 3/2010 | Kimura et al. |
| 2010/0225202 A1 | 9/2010 | Fukano et al. |
| 2012/0032759 A1 | 2/2012 | Nishii et al. |
| 2016/0079957 A1 | 3/2016 | Kikuchi et al. |
| 2018/0269854 A1 | 9/2018 | Kishino |

FOREIGN PATENT DOCUMENTS

| | | |
|---|---|---|
| JP | 2013-229421 A | 11/2013 |
| JP | 2014-239516 A | 12/2014 |
| WO | 2010/125873 A1 | 11/2010 |
| WO | 2014/192614 A1 | 12/2014 |
| WO | 2016/088804 A1 | 6/2016 |

\* cited by examiner

ELASTIC WAVE DEVICE, DUPLEXER, AND COMMUNICATION DEVICE

FIELD

The present disclosure relates to an elastic wave device as an electronic component that uses elastic waves such as surface acoustic waves (SAW), a duplexer including the elastic wave device, and a communication device including the elastic wave device.

BACKGROUND

A wafer-level package (WLP) device is an example of a known elastic wave device (refer to, for example, Patent Literature 1). A WLP elastic wave device includes, for example, a piezoelectric substrate, excitation electrodes arranged on the upper surface of the piezoelectric substrate, a cover covering the upper surface of the piezoelectric substrate from above the excitation electrodes to seal the excitation electrode, terminals (via conductors) extending through the cover, and a conductive layer located on the upper surface of the cover to reinforce the cover. The terminals have lower ends connected to the excitation electrodes via a wiring pattern on the upper surface of the piezoelectric substrate. The upper ends of the terminals may be connected to the conductive layer on the cover.

CITATION LIST

Patent Literature

Patent Literature 1: Japanese Unexamined Patent Application Publication No. 2010-56671

BRIEF SUMMARY

Technical Problem

An elastic wave device according to one aspect of the present disclosure includes a substrate including a piezoelectric substrate, at least one excitation electrode located on an upper surface of the piezoelectric substrate, a cover covering an upper surface of the substrate from above the at least one excitation electrode, at least one first via conductor extending through at least part of the cover from the upper surface of the substrate to an upper surface of the cover, at least one second via conductor located, on the substrate, inward from the at least one first via conductor in a plan view, extending through at least part of the cover from the upper surface of the substrate to the upper surface of the cover, and having a smaller diameter than the at least one first via conductor, and a conductive layer located on the upper surface of the cover or in the cover, and extending over an upper end of the at least one second via conductor.

An elastic wave device according to another aspect of the present disclosure includes a substrate including a piezoelectric substrate, an excitation electrode located on an upper surface of the piezoelectric substrate, a cover covering an upper surface of the substrate from above the excitation electrode, at least one through-hole extending through the cover from the upper surface of the substrate to an upper surface of the cover, at least one via conductor located, on the substrate, inward from the at least one through-hole in a plan view, extending through at least part of the cover from the upper surface of the substrate to the upper surface of the cover, and having a smaller diameter than the at least one through-hole, and a conductive layer located on the upper surface of the cover or in the cover, and extending over an upper end of the at least one via conductor.

A duplexer according to another aspect of the present disclosure includes a transmission filter connected to a terminal, and a reception filter connected to the terminal. The transmission filter and/or the reception filter includes the elastic wave device according to any one of the above aspects.

A communication apparatus according to another aspect of the present disclosure includes an antenna, the elastic wave device according to any one of the above aspects connected to the antenna, and an integrated circuit connected to the elastic wave device.

DETAILED DESCRIPTION

Figure 1:
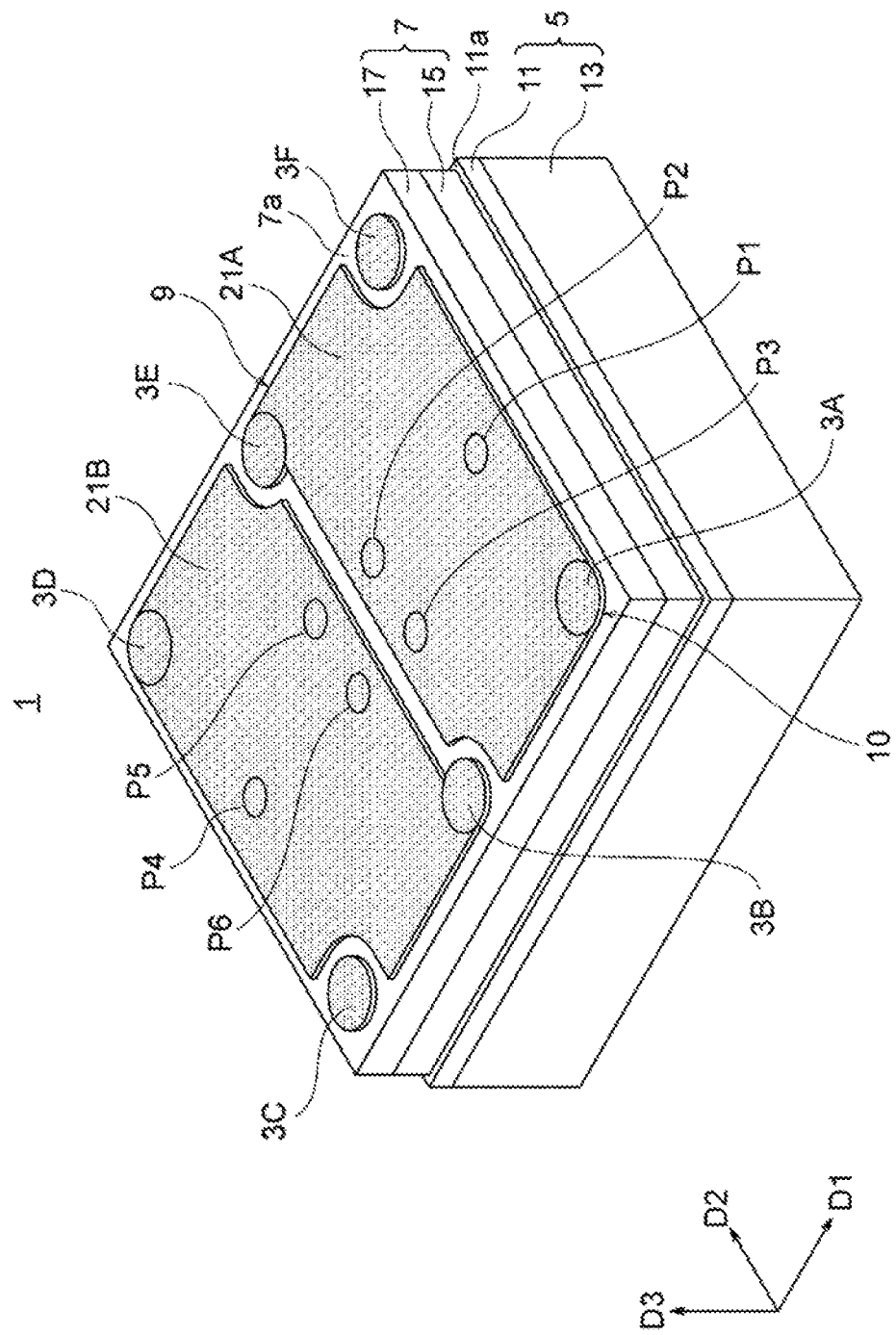
FIG. 1 is an external perspective view of a SAW device according to an embodiment.

Embodiments of the present disclosure will now be described with reference to the drawings. The drawings used herein are only schematic, and the dimensions, ratios, or other parameters in the drawings may differ from the actual ones. For convenience, the surface of a conductor layer (in a view other than a cross-sectional view) may be hatched.

The same or similar components may be given the same names and the same reference numerals followed by different alphabetical letters, such as terminals 3A and 3B. For simplicity, the components may be referred to without alphabetical letters as, for example, terminals 3.

Although a SAW device according to the present disclosure may have any faces oriented upward or downward, the SAW device is herein described using the orthogonal coordinate system including axes D1, D2, and D3 for convenience, in which the positive direction along the axis D3 is an upward direction, and directional terms such as an upper surface or a lower surface may be used accordingly. A plan view or a plan perspective view refers to a view in the direction along the axis D3, unless otherwise specified. The axis D1 is defined parallel to the propagation direction of SAWs along the upper surface of a piezoelectric substrate (described later). The axis D2 is defined parallel to the upper surface of the piezoelectric substrate and orthogonal to the axis D1. The axis D3 is defined orthogonal to the upper surface of the piezoelectric substrate.

Overall Structure of SAW Device

Figure 2:
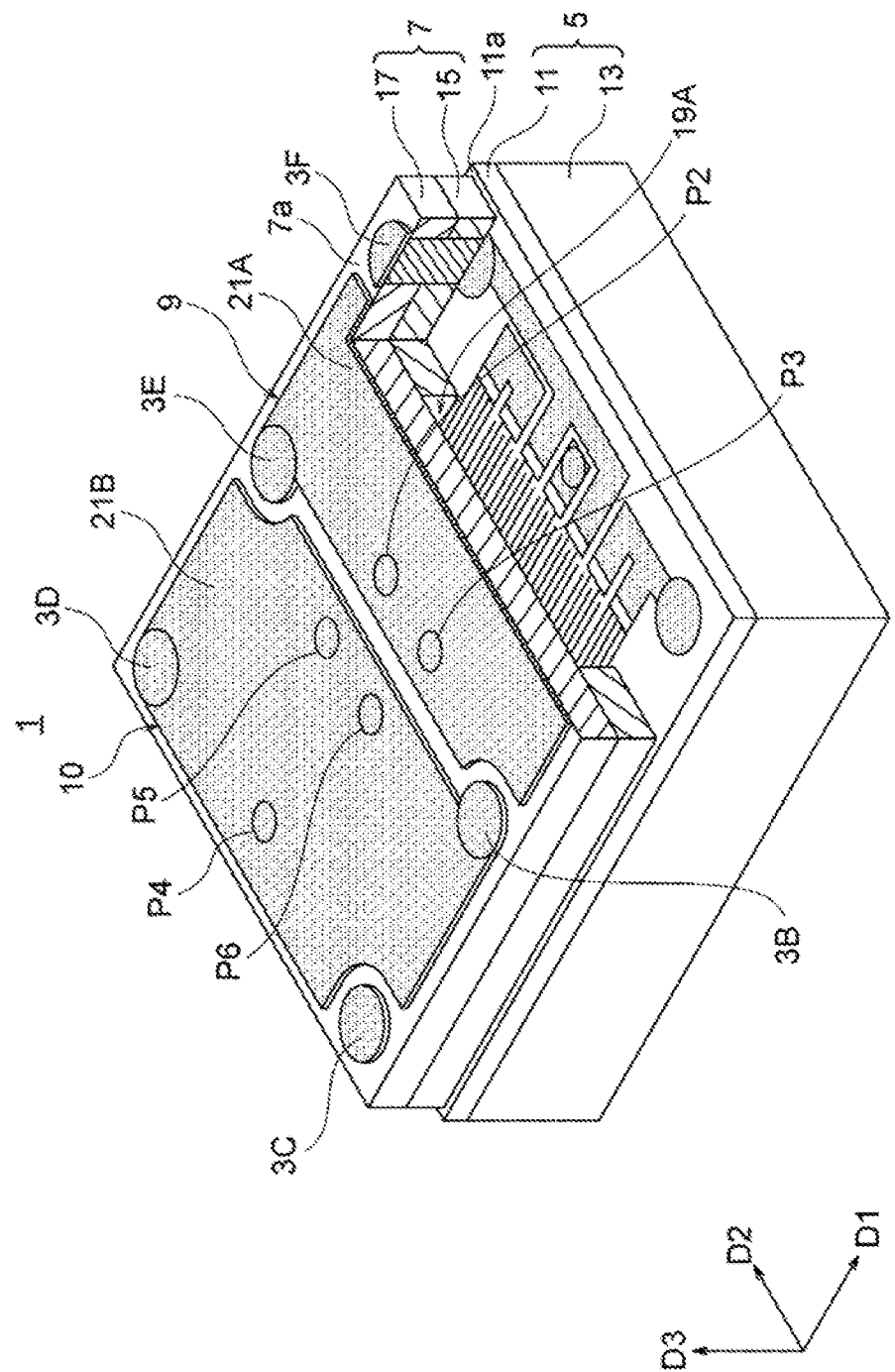
FIG. 2 is a perspective partially broken view of the SAW device shown in FIG. 1.
Figure 3:
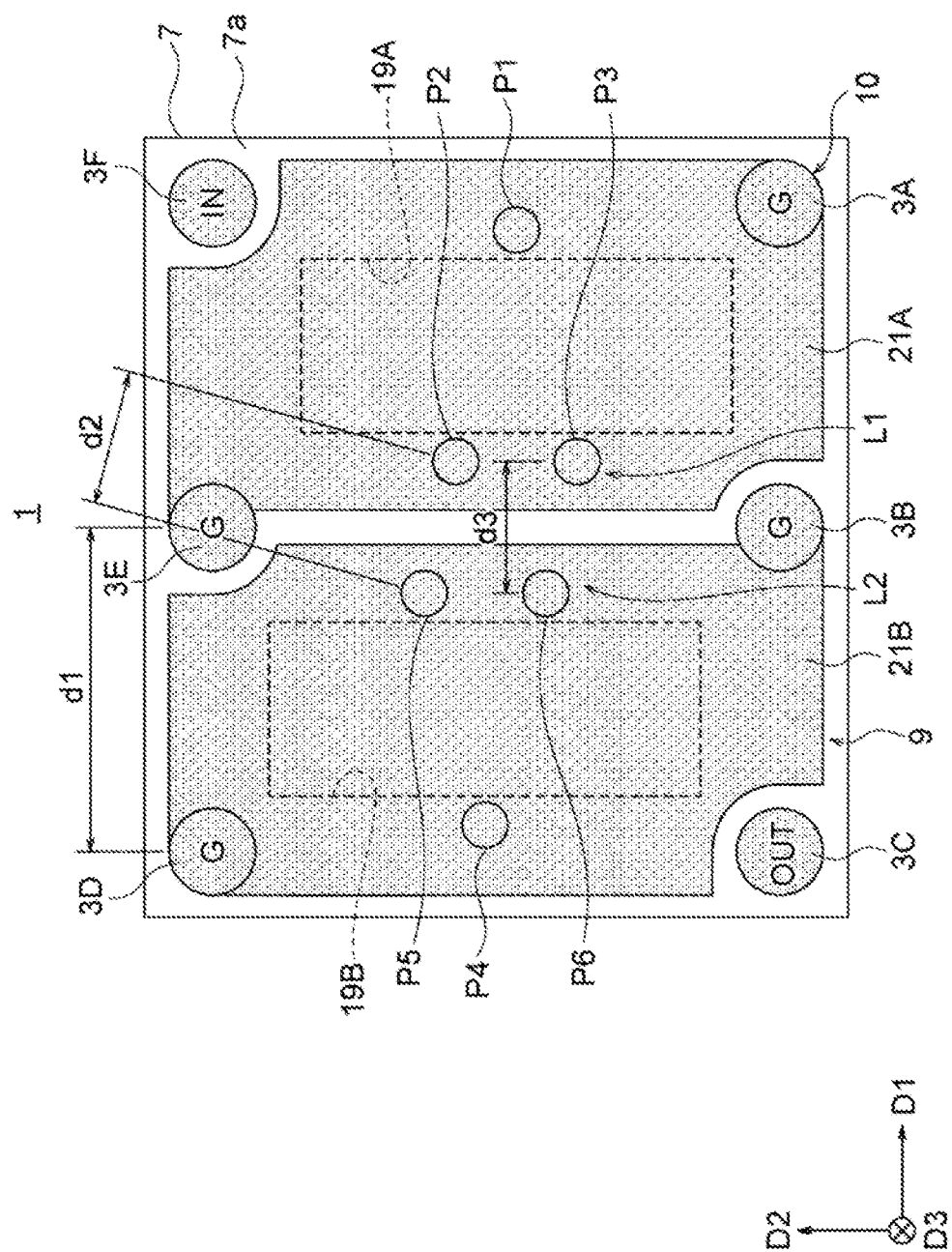
FIG. 3 is a top view of the SAW device shown in FIG. 1.

FIG. 1 is an external perspective view of a SAW device 1 according to an embodiment. FIG. 2 is a perspective partially broken view of the SAW device 1. FIG. 3 is a top view of the SAW device 1.

The SAW device 1 is a wafer-level package (WLP) electronic component, and has a profile of, for example, a substantially thin rectangular prism. The SAW device 1 may have any dimensions. For example, in a plan view, the side length (in the direction along the axis D1 or D2) is 0.3 to 2 mm, and the thickness (in the direction along the axis D3) is 0.2 to 0.6 mm.

Multiple (six in the illustrated example) terminals 3A to 3F are uncovered on the upper surface of the SAW device 1. The SAW device 1 receives signals through any one of the terminals 3. The received signals are, for example, filtered by the SAW device 1. The SAW device 1 then outputs the filtered signals through any one of the terminals 3.

The SAW device 1 is mounted on a circuit board (not shown) to have for example, the upper surface facing the circuit board, and pads on the circuit board and the corresponding terminals 3 bonded together by bumps 45 (refer to FIG. 5A), such as solder bumps. Thereafter, a molding resin (not shown) is fed around the SAW device 1 by transfer molding or another process to seal the SAW device 1. A gap between the circuit board and the SAW device 1 may also be filled with a molding resin.

The SAW device 1 includes, for example, a substrate 5, a cover 7 covering the upper surface of the substrate 5, the above terminals 3 uncovered on an upper surface 7a of the cover 7, and a reinforcement layer 9 overlapping the upper surface 7a of the cover 7. The reinforcement layer 9 and the portions of the terminals 3 on the cover 7 form a conductive layer 10.

Substrate

The substrate 5 includes, for example, a piezoelectric substrate 11, and a support substrate 13, directly or indirectly bonded to the lower surface of the piezoelectric substrate 11.

The piezoelectric substrate 11 is formed from, for example, a piezoelectric single crystal. Examples of the single crystal include lithium tantalate (LiTaO$_3$), lithium niobate (LiNbO$_3$), and quartz (SiO$_2$). The single crystal may have any cut angle. For example, the piezoelectric substrate 11 is a rotated Y-cut X-propagating crystal. More specifically, the X-axis is parallel to the upper surface (axis D2) of the piezoelectric substrate 11, and the Y-axis is inclined by a predetermined angle with respect to the normal to the upper surface of the piezoelectric substrate 11.

The piezoelectric substrate 11 has, for example, a rectangular planar shape. The piezoelectric substrate 11 may have any size, for example, a side length (in the direction along the axis D1 or D2) of 0.3 to 2 mm and a thickness (in the direction along the axis D3) of 0.1 to 30 µm in a plan view.

For example, the support substrate 13 is formed from a material having a smaller coefficient of thermal expansion than the material for the piezoelectric substrate 11. For example, this material does not facilitate thermal expansion of the piezoelectric substrate 11, and thus reduces changes in the electrical characteristics of the SAW device 1 due to heat. Examples of the material include a semiconductor, such as silicon, a single crystal such as sapphire, and ceramics such as a sintered aluminum oxide. The support substrate 13 may be a laminate of multiple layers formed from different materials.

The support substrate 13 may have the same planar shape and dimensions as the piezoelectric substrate 11 or may have a different shape and dimensions in a plan view. In this example, the support substrate 13 has the same planar shape and dimensions as the piezoelectric substrate 11. The support substrate 13 may have any thickness. For example, the support substrate 13 is thicker than the piezoelectric substrate 11. For example, the support substrate 13 has a thickness of at least ten times the thickness of the piezoelectric substrate 11, for example, 100 to 300 µm.

The piezoelectric substrate 11 and the support substrate 13 are bonded together with, for example, an interlayer (not shown) placed between the substrates 11 and 13. The interlayer may be formed from an organic or inorganic material. Examples of the organic material include resin such as a thermosetting resin. Examples of the inorganic material include SiO$_2$, Si$_3$N$_4$, and AlN. A laminate of thin layers formed from different materials may be used as an interlayer. Such a laminate may form, for example, a sound reflecting film. The piezoelectric substrate 11 and the support substrate 13 may have bonded surfaces activated by plasma or neutron beam irradiation, and then directly bonded together without an interlayer (direct bonding).

Cover

The cover 7 includes, for example, a frame 15 having at least one opening in a plan view, and a lid 17 that closes the opening of the frame 15. The cover 7 defines spaces 19A (FIG. 2) and 19B (FIGS. 2 and 3) above an upper surface 11a of the piezoelectric substrate 11 for facilitating vibrations of the upper surface 11a. Any number of spaces 19 may be provided. In the present embodiment, two spaces 19 are provided as shown in FIG. 3.

The frame 15 includes, for example, a layer with a substantially uniform thickness (directly or indirectly) placed on the upper surface 11a of the piezoelectric substrate 11. The frame 15 has a thickness (height of the space 19) of, for example, 5 to 30 µm. The lid 17 includes, for example, a layer with a substantially uniform thickness placed on the frame 15. The lid 17 has a thickness of, for example, 5 to 30 µm.

The frame 15 and the lid 17 may be formed from the same material or different materials. For ease of explanation, the frame 15 and the lid 17 are clearly divided by a boundary in FIGS. 1 and 2, but may be integrally formed from the same material in actual products.

The cover 7 (frame 15 and lid 17) is basically formed from an insulating material. Examples of the insulating material include a photosensitive resin. Examples of the photosensitive resin include acrylic, epoxy, and imide resins. The cover 7 may have any coefficient of thermal expansion, for example, greater than the coefficient of thermal expansion of a piezoelectric material used for the piezoelectric substrate 11.

Arrangement of Terminals

The terminals 3 extend through the cover 7, for example, from the upper surface 11a of the piezoelectric substrate 11 to the upper surface 7a of the cover 7 and uncovered on the upper surface 7a. The number and the arrangement of the terminals 3 may be determined as appropriate in accordance with the configuration of the circuit on the upper surface 11a of the piezoelectric substrate 11. In the illustrated example, the terminals 3 are arranged along the outer periphery of the cover 7 (piezoelectric substrate 11) that is rectangular in a plan view.

The terminals 3A to 3F may have any functions. In the present embodiment, for example, the terminal 3F is used for receiving input signals, the terminal 3C is used for outputting signals, and the other terminals 3 (3A, 3B, 3D, and 3E) receive a reference potential. In FIG. 3, the terminal for receiving input signals is denoted with IN, the terminal for receiving input signals is denoted with OUT, and the terminals for receiving a reference potential are denoted with G (the same applies to pads 25 in FIG. 4 described later).

Reinforcement Layer

The reinforcement layer 9 is formed from, for example, a conductor layer with a substantially uniform thickness on the upper surface 7a of the cover 7. Examples of the conductor include metal, such as Cu. From another perspective, the reinforcement layer 9 is formed from, for example, a material having a higher Young's modulus than the material for the cover 7. The reinforcement layer 9 may include multiple conductor layers (multiple materials). The materials for the reinforcement layer 9 and the cover 7 may have different coefficients of thermal expansion. For example, the material for the reinforcement layer 9 has a smaller coefficient of thermal expansion than the material for the cover 7. The reinforcement layer 9 may have any thickness, for example, 20 to 30 μm.

The reinforcement layer 9 includes a section 21A, which covers the space 19A, and a section 21B, which covers the space 19B. The sections 21A and 21B are spaced from each other. Each section 21 has a larger area than, for example, the space 19 covered with the section 21, and the space 19 is within the section 21 in a plan perspective view. The section 21 may have the outer edge partially or entirely located within the space 19.

Conductor Pattern on Piezoelectric Substrate

Figure 4:
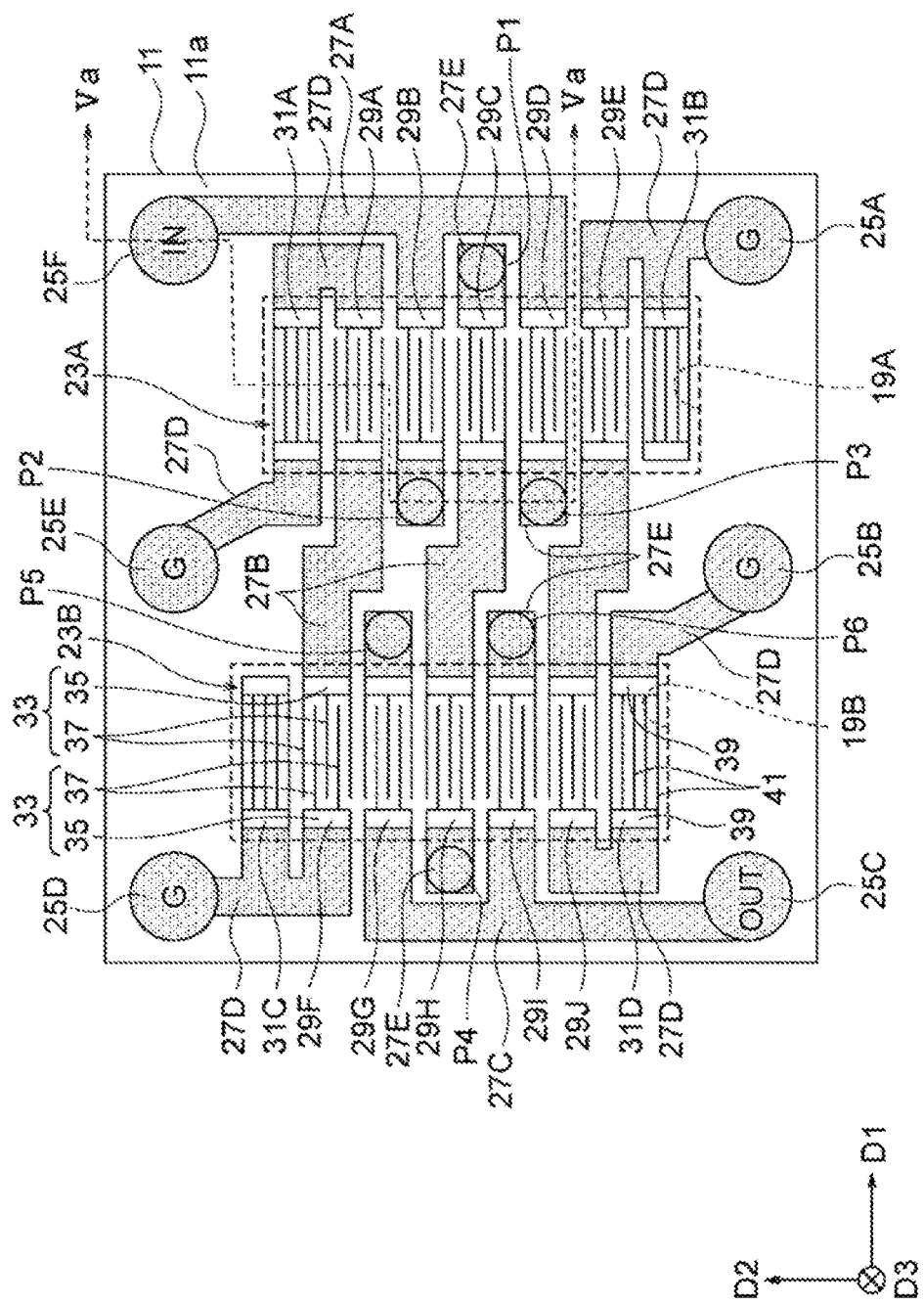
FIG. 4 is a top view of a piezoelectric substrate included in the SAW device shown in FIG. 1.

FIG. 4 is a schematic top view of the piezoelectric substrate 11 showing its conductor pattern.

The piezoelectric substrate 11 has a patterned conductor layer on the upper surface 11a. The patterned conductor includes, for example, two SAW filters 23 (23A and 23B), multiple pads 25 (25A to 25F), and multiple wires 27 (27A to 27E) connecting the filters and the pads.

SAW Filters

The SAW filters 23 are, for example, multimode (including dual) SAW resonator filters. For example, the SAW filters 23 each include multiple (five in the illustrated example) interdigital transducer (IDT) electrodes 29 (29A to 29J) arranged in the propagation direction of elastic waves, and a pair of reflectors 31 (31A to 31D) on both sides of the electrodes.

The IDT electrodes 29 each include a pair of interdigital electrodes 33, which are given numerals in the same manner as for the IDT electrode 29F. Each interdigital electrode 33 includes a bus bar 35 and electrode fingers 37 extending parallel to each other from the bus bar 35. The pair of interdigital electrodes 33 are arranged to have the electrode fingers 37 meshing (or overlapping) with each other.

The bus bars 35 are elongated and extend straight in, for example, the propagation direction of SAWs (in the direction along the axis D1) with a substantially uniform width. The pair of bus bars 35 face each other in the direction orthogonal to the SAW propagation direction (in the direction along the axis D2). The bus bars 35 may have varying widths or may be inclined with respect to the SAW propagation direction.

The electrode fingers 37 are elongated and extend straight in, for example, the direction orthogonal to the SAW propagation direction (in the direction along the axis D2) with a substantially uniform width. Each interdigital electrode 33 has the electrode fingers 37 arranged in the SAW propagation direction. The electrode fingers 37 of one interdigital electrode 33 and the electrode fingers 37 of the other interdigital electrode 33 are basically arranged alternately.

The electrode fingers 37 in each IDT electrode 29 are basically arranged at a uniform pitch, which is, for example, the center-to-center distance of two adjacent electrode fingers 37. Some of the IDT electrodes 29 may include a narrowly-pitched or widely-pitched portion, which is pitched more narrowly or widely than the other portion. The pitch between the adjacent electrode fingers 37 of different IDT electrodes 29 is basically the same as the pitch in each IDT electrode 29.

The number of electrode fingers 37 may be determined as appropriate in accordance with, for example, intended electrical characteristics. FIG. 4 schematically shows fewer electrode fingers 37 than actually used. More electrode fingers 37 may be actually arranged. The same applies to strip electrodes 41 in reflectors 31 described later.

For example, the electrode fingers 37 have the same length. The IDT electrodes 29 may undergo apodization to have the electrode fingers 37 with different lengths (from another prospective, overlapping widths) depending on the positions in the propagation direction. Each IDT electrode 29 may include a dummy electrode protruding from the bus bar 35 between the electrode fingers 37.

Each reflector 31 is formed in, for example, a grid. More specifically, each reflector 31 includes a pair of opposing bus bars 39, and strip electrodes 41 extending between the pair of bus bars 39. The pitch between the strip electrodes 41 and the pitch between the strip electrode 41 and its adjacent electrode finger 37 are basically the same as the pitch between the electrode fingers 37.

In the above multimode SAW filters 23, one of the paired interdigital electrodes 33 of each IDT electrode 29 receives or outputs signals (signal use), and the other interdigital electrode 33 receives the reference potential (or for reference potential use). In each IDT electrode 29, the interdigital electrode 33 for signal use or for reference potential use may be located in the positive or negative direction along the axis D1. Either the interdigital electrode 33 in the positive direction or the interdigital electrode 33 in the negative direction along the axis D1 is for signal use or for reference potential use may be the same or different among the IDT electrodes 29 adjacent to each other in the direction along the axis D2. In the present embodiment, the interdigital electrode 33 for signal use and the interdigital electrode 33 for reference potential are arranged differently between the adjacent IDT electrodes 29.

The multimode SAW filter 23 can receive or output either unbalanced or balanced signals. An unbalanced signal is, for example, a single signal that uses, as a signal level, a potential with reference to the reference potential. A balanced signal includes, for example, two signals of opposite phases that use, as a signal level, a potential difference between the signals. The multimode SAW filter 23 may convert a balanced signal to an unbalanced signal, or an unbalanced signal to a balanced signal. In the present embodiment, unbalanced signals are used for both input and output signals.

The reflectors 31 may electrically float or receive the reference potential. In the present embodiment, the reflectors 31 receive the reference potential.

Pads and Wires

The pads 25 are connected to the lower ends of the terminals 3. The pads 25A to 25F are respectively connected to the terminals 3A to 3F. The pad and the terminal connected together are given reference numerals followed by the same alphabetical letters. More specifically, the pad 25F receives signals, the pad 25C outputs signals, and the other pads (25A, 25B, 25D, and 25E) receive the reference potential. The number and the arrangement of the terminals 3 in a plan view described above may apply to the pads 25. The pads 25 may have any planar shape, for example, a circular shape with substantially the same size as the lower ends of the terminals 3.

The wire 27A receives signals to be input to the SAW filter 23A, and connects, for example, the pad 25F to the SAW filter 23A. More specifically, for example, the wire 27A extends linearly from the pad 25F, and bifurcates and connects to the bus bars 35 in the positive D1 direction of the IDT electrodes 29B and 29D.

The wires 27B transmit signals between the two SAW filters 23, and connect the two SAW filters 23 together. From another perspective, the wires 27B output signals from the SAW filter 23A, and also receive signals to be input to the SAW filter 23B. More specifically, for example, the wires 27B include three wires. One wire 27B connects the bus bar 35 in the negative D1 direction of the IDT electrode 29A to the bus bar 35 in the positive D1 direction of the IDT electrode 29F. Another wire 27B connects the bus bar 35 in the negative D1 direction of the IDT electrode 29C to the bus bar 35 in the positive D1 direction of the IDT electrode 29H. Another wire 27B connects the bus bar 35 in the negative D1 direction of the IDT electrode 29E to the bus bar 35 in the positive D1 direction of the IDT electrode 29J.

The wire 27C outputs signals from the SAW filter 23B, and connects, for example, the SAW filter 23B to the pad 25C. More specifically, for example, the wire 27C has two portions extending from the bus bars 35 in the negative D1 direction of the IDT electrodes 29G and 29I and merging midway and extending to the pad 25C.

Each wire 27D applies the reference potential to the SAW filter 23, and connects, for example, the pad 25A, 25B, 25D, or 25E to the SAW filter 23A or 23B. The wire 27D also connects, for example, the pad 25A, 25B, 25D, or 25E to the reflector 31A, 31B, 31C, or 31D. More specifically, for example, the wire 27D extending from the pad 25A is connected to the bus bar 39 in the positive D1 direction of the reflector 31B and the bus bar 35 in the positive D1 direction of the IDT electrode 29E. The wire 27D extending from the pad 25D is connected to, for example, the bus bar 39 in the negative D1 direction of the reflector 31C and the bus bar 35 in the negative D1 direction of the IDT electrode 29F. The wire 27D extending from the pad 25E is connected to, for example, the bus bar 39 in the negative D1 direction of the reflector 31A. The bus bar 35 in the positive D1 direction of the IDT electrode 29A is connected to, for example, the bus bar 39 in the positive D1 direction of the reflector 31A directly and/or through the wire 27D, and to the pad 25E via the reflector 31A. The wire 27D extending from the pad 25B is connected to, for example, the bus bar 39 in the positive D1 direction of the reflector 31D. The bus bar 35 in the negative D1 direction of the IDT electrode 29J is connected to, for example, the bus bar 39 in the negative D1 direction of the reflector 31D directly and/or through the wire 27D, and to the pad 25B via the reflector 31D.

The wires 27E apply the reference potential to the SAW filters 23. Unlike the wires 27D, the wires 27E are not connected to the pads 25 receiving the reference potential on the piezoelectric substrate 11, but are connected to the terminals 3 for the reference potential via components such as second via conductors 51 (FIG. 5A) described later. The wires 27E on the piezoelectric substrate 11 extend from the SAW filters 23, and are then disconnected from other patterns. More specifically, for example, the wires 27E include six wires extending from the bus bar 35 in the negative D1 direction of the IDT electrode 29B, the bus bar 35 in the positive D1 direction of the IDT electrode 29C, the bus bar 35 in the negative D1 direction of the IDT electrode 29D, the bus bar 35 in the positive D1 direction of the IDT electrode 29G, the bus bar 35 in the negative D1 direction of the IDT electrode 29H, and the bus bar 35 in the positive D1 direction of the IDT electrode 29I.

For example, the pads 25 (25A and 25E) that apply the reference potential to the SAW filter 23A and the pads 25 (25B and 25D) that apply the reference potential to the SAW filter 23B are not short-circuited. More specifically, the two sets of pads are electrically connected to each other via, for example, the SAW filters 23, but are not connected through the wires 27.

In the above circuit on the piezoelectric substrate 11, signals input to the pad 25F are input to the IDT electrodes 29B and 29D through the wire 27A, and filtered by the SAW filter 23A. The filtered signals are output from the IDT electrodes 29A, 29C, and 29E and input to the IDT electrodes 29F, 29H, and 29J through the three wires 27B, and filtered by the SAW filter 23B. The filtered signals are output from the IDT electrodes 29G and 29I to the pad 25C through the wire 27C.

Insulating Layer and Bumps

Figure 5A:
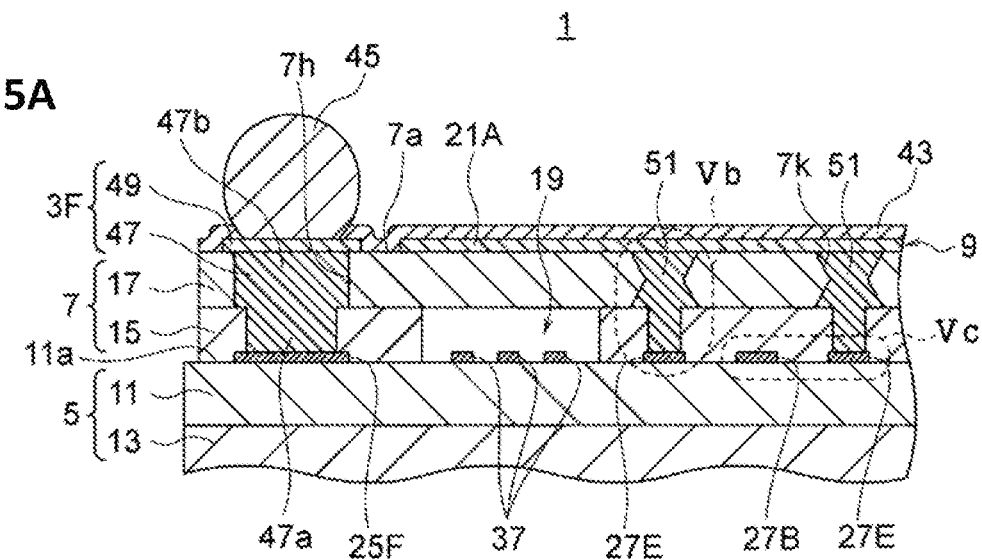
FIG. 5A is a cross-sectional view taken along line Va-Va in FIG. 4.

FIG. 5A is a schematic cross-sectional view taken along line Va-Va in FIG. 4.

As described above, the SAW device 1 includes the substrate 5, the cover 7, and the reinforcement layer 9 (conductive layer 10) that are stacked on one another in the stated order. The substrate 5 and the cover 7 define the space 19 above the IDT electrodes 29 (electrode fingers 37 schematically shown in FIG. 5A).

The SAW device 1 may also include an insulating layer 43, which covers the reinforcement layer 9, and/or bumps 45 on the terminals 3.

The insulating layer 43 covers, for example, the entire upper surface of the cover 7 from above the reinforcement layer 9 without covering the terminals 3. The insulating layer 43 covers, for example, the entire upper surface and side surfaces of the reinforcement layer 9. The insulating layer 43 may leave the entire upper surfaces of the terminals 3 uncovered, or may cover the edges of the upper surfaces of the terminal 3. The insulating layer 43 reduces, for example, the likelihood that the terminals and the reinforcement layer 9, which are to be disconnected from each other, are short-circuited by the bumps 45 that are unintentionally spread over the terminals 3.

The insulating layer 43 has a substantially uniform thickness at least over the reinforcement layer 9. The insulating layer 43 has a thickness of, for example, 500 nm to 20 μm. The insulating layer 43 is formed from, for example, a resin. Examples of the resin may include an epoxy resin, typically used as a solder resist. In some embodiments, the insulating layer 43 may be formed from an inorganic material. Examples of the inorganic material include a silicon oxide (such as $SiO_2$), a silicon nitride, and silicon.

The bumps 45 are formed on the terminals 3 and are substantially spherical. The bumps 45 have substantially the same diameter as the upper surface of the terminals 3. The bumps 45 are formed from, for example, solder. Examples of the solder include a lead solder, such as a Pb—Sn alloy solder, and a lead-free solder, such as an Au—Sn alloy solder, an Au—Ge alloy solder, an Sn—Ag alloy solder, and an Sn—Cu alloy solder.

Although not specifically shown, the upper surface 11a of the piezoelectric substrate 11 may be covered with a protective coating of, for example, $SiO_2$ or $Si_3N_4$ from above the conductor pattern (including the wires 27, the IDT electrodes 29, and the reflectors 31 and excluding the pads 25). The protective coating may be a laminate of multiple layers of a material selected from the above listed materials. The protective coating may simply prevent corrosion of the IDT electrodes 29 and other components, or may provide temperature compensation. A structure including the protective coating may include, for example, an additional coating of an insulator or metal on the upper or lower surfaces of the IDT electrodes 29 and the reflectors 31 to improve the reflection coefficient of SAWs.

The protective coating may or may not be placed between the piezoelectric substrate 11 and the frame 15. In other words, the cover 7 may be either directly or indirectly mounted on the upper surface 11a of the piezoelectric substrate 11.

Structure of Terminals

Each terminal 3 includes, for example, a first via conductor 47, which extends through the cover 7, and a land 49 on the first via conductor 47. Although only the terminal 3F is shown in FIG. 5A, the other terminals 3 have the same structure as the terminal 3F. The conductive layer 10 includes the land 49 and the reinforcement layer 9.

The first via conductor 47 extends throughout the cover 7 from the upper surface of the substrate 5, or the upper surface 11a of the piezoelectric substrate 11, to the upper surface 7a of the cover 7. The first via conductors 47 are located on the pads 25, and have their lower ends connected to the pads 25. In other words, the cover 7 has through-holes 7h above the pads 25.

The first via conductor 47 includes a lower portion 47a, which extends through the frame 15, and an upper portion 47b, which extends through the lid 17. The lower and upper portions 47a and 47b are, for example, substantially cylindrical. The lower and upper portions 47a and 47b have a diameter of, for example, 50 to 120 µm. For example, the upper portion 47b has a larger diameter than the lower portion 47a. The diameter difference between the lower and upper portions 47a and 47b is, for example, 5 to 20 µm.

The upper surface of the lower portion 47a and the lower surface of the upper portion 47b may have the same diameter. The side surfaces of the lower and upper portions 47a and 47b may be inclined. More specifically, the side surfaces may be tapered in the thickness direction.

The land 49 is, for example, a layered conductor with a substantially uniform thickness, which may be substantially the same as the thickness of, for example, the reinforcement layer 9. The land 49 may have any planar shape, such as a circle. The land 49 has a larger diameter than, for example, the upper end surface of the first via conductor 47. The outer periphery of the land 49 thus serves as a flange on the cover 7. The diameter difference between the land 49 and the upper end surface of the first via conductor 47 is, for example, 5 to 100 µm. The land 49 may have the same diameter as the first via conductor 47.

For example, the first via conductor 47 and the land 49 are integrally formed from the same material. The terminals 3 are formed from metal, such as Cu. The terminals 3 may be formed from multiple materials. For example, the outer peripheral surface of the first via conductor 47 and the lower surface of the flange of the land 49 may be formed from a material different from the material used for the inner portions of the terminals 3. The upper surface of the land 49 may be covered with a layer formed from a metal different from the material used for the other portions of the terminals 3. For example, the terminals 3 may be mainly formed from Cu, and the upper surface of the land 49 may be formed from Au or Ag.

Connection between Terminals and Reinforcement Layer

As shown in FIGS. 1 and 3, the lands 49 in the terminals 3 (3A, 3B, 3D, and 3E) that receive the reference potential are continuous to, for example, the reinforcement layer 9. Thus, the reinforcement layer 9 receives the reference potential. The lands 49 in the terminals 3C and 3F, to or from which signals are input or output, are separate from the reinforcement layer 9.

More specifically, the section 21A of the reinforcement layer 9 facing the SAW filter 23A (space 19A) is connected to only the terminals 3 (3A and 3E), among the terminals 3 for receiving the reference potential, to apply the reference potential to the SAW filter 23A. The section 21B of the reinforcement layer 9 facing the SAW filter 23B (space 19B) is connected to only the terminals 3 (3B and 3D), among the terminals 3 for receiving the reference potential, to apply the reference potential to the SAW filter 23B.

The lands 49 may be formed from a conductor layer (or layers) using the same material and having the same thickness as the reinforcement layer 9, or only portions of the conductor layer formed from the same material and having the same thickness as the reinforcement layer 9 as the lands 49 may have upper surfaces covered with another metal layer. For example, the lands 49 and the reinforcement layer 9 (conductive layer 10) may be mainly formed from Cu, and the upper surfaces of the lands 49 may be formed from Au or Ag. The conductor layer formed from the same material and having the same thickness as the reinforcement layer 9 may be integrally formed with the reinforcement layer 9 and with the lands 49 connected to the reinforcement layer 9.

Arrangement and Connection of Second Via Conductors

As shown in FIG. 5A, the SAW device 1 includes second via conductors 51 (or through-holes 7k from another perspective) provided on the wires 27E, which apply the reference potential to the IDT electrodes 29, and extending through the cover 7. Although FIG. 5A shows only two wires 27E, the second via conductors 51 are also arranged on other wires 27E. In FIGS. 1 to 4, the circles indicate the positions P1 to P6 of the second via conductors 51.

The second via conductors 51 have their upper ends connected to the reinforcement layer 9. As described above, the reinforcement layer 9 is connected to the terminals 3 for receiving the reference potential. The wires 27E are connected to the terminals 3 for the reference potential via the second via conductors 51 and the reinforcement layer 9.

More specifically, for example, the second via conductors 51 (at positions P1 to P3) on the wires 27E extending from the SAW filter 23A are connected to the section 21A of the reinforcement layer 9 facing the SAW filter 23A. For example, the second via conductors 51 (at positions P4 to P6) on the wires 27E extending from the SAW filter 23B are connected to the section 21B of the reinforcement layer 9 facing the SAW filter 23B.

From another perspective, the second via conductors 51 are connected to each other via the reinforcement layer 9. More specifically, for example, the second via conductors 51 at the positions P1 to P3 are connected to each other via the section 21A, and the second via conductors 51 at the positions P4 to P6 are connected to each other via the section 21B.

The second via conductors 51 connected to each other via the reinforcement layer 9 form three-dimensional wiring including wires with different potentials (input signals, output signals, or reference potential) crossing each other three-dimensionally without being short-circuited. In other words, the multilevel crossing in the present embodiment is achieved by defining the spaces and using the cover 7.

For example, the wire 27E extending from the IDT electrode 29B to the position P2, the second via conductor 51 at the position P2, the section 21A, the second via conductor 51 at the position P3, and the wire 27E extending from the position P3 to the IDT electrode 29D form three-dimensional wiring crossing the wire 27B, which connects the IDT electrode 29C to the IDT electrode 29H. In other words, the multilevel crossing is achieved by a wire for transmitting signals and a wire for receiving the reference potential.

Although not described specifically, three-dimensional wiring crossing the wire 27A for inputting signals and three-dimensional wiring crossing the wire 27C for outputting signals are also defined as clearly illustrated in the figures. For the connection between the positions P1 and P2, three-dimensional wiring crossing the IDT electrodes 29 is also defined.

A connection between the terminals 3 and the second via conductors 51 via the reinforcement layer 9 also forms three-dimensional wiring having wires with different potentials that three-dimensionally cross each other without being short-circuited.

For example, the wire 27E extending from the IDT electrode 29B to the position P2, the second via conductor 51 at the position P2, the section 21A, the terminal 3E, and the wire 27D extending from the terminal 3E to the reflector 31A form the three-dimensional wiring crossing the wire 27B, which connects the IDT electrode 29A to the IDT electrode 29F. In other words, the multilevel crossing is also achieved by a wire for transmitting signals and a wire for receiving the reference potential.

As indicated at the positions P1 to P6 in FIGS. 3 and 4, in a plan view, the second via conductors 51 are located, on the substrate 5 (piezoelectric substrate 11) (and/or the cover 7; the same applies hereafter), inward from the first via conductors 47 (terminals 3).

For example, when the distance (minimum distance; the same applies hereafter) between the centroid of each second via conductor 51 and the outer edge of the substrate 5 (piezoelectric substrate 11 in this example) in a plan view is longer than the distance between the centroid of each first via conductor 47 and the outer edge of the substrate 5 (piezoelectric substrate 11 in this example) in a plan view, the second via conductors 51 may be referred to as being located inward from the first via conductors 47. The centroid in a figure is a point at which the sum of the first moments is zero, and the centroid of a circle is the center. In the illustrated example, all the second via conductors 51 are located inward from all the first via conductors 47.

When all the second via conductors 51 are located inward from all the first via conductors 47 in a plan view, the second via conductors 51 may be referred to as being located inward from the first via conductors 47. More specifically, when the shortest distance between a point on the outer edge of any second via conductor 51 and the outer edge of the piezoelectric substrate 11 is longer than the longest distance between a point on the outer edge of any first via conductor 47 and the outer edge of the piezoelectric substrate 11, the second via conductors 51 may be referred to as being located inward from the first via conductors 47. In the illustrated example, the second via conductors 51 at the positions P2, P3, P5, and P6 are located inward from all the first via conductors 47.

As shown in FIG. 3, a shortest distance d2 between the second via conductors 51 is shorter than a shortest distance d1 between the first via conductors 47 (terminals 3). For example, the distances d1 and d2 are the distances between the centroids of the via conductors in a plan view. The distances d1 and d2 may be the shortest distances between the outer edges (the size of a gap between the via conductors).

As shown in FIG. 3, the second via conductors 51 at the positions P2 and P3 are arranged in a first row L1 in the direction along the axis D2. Similarly, the second via conductors 51 at the positions P5 and P6 are arranged in a second row L2 in the direction along the axis D2. The first and second rows L1 and L2 are adjacent to each other in parallel.

Being adjacent to each other herein refers to the arrangement with no via conductor (47 or 51) other than the via conductors in these rows placed between the first and second rows L1 and L2. In the illustrated example, the distance d3 between the first and second rows L1 and L2 is shorter than any of the distances (including d1 and d2) between the via conductors. For example, the distance d3 is the distance between lines connecting the centroids of the second via conductors 51 in these rows.

The second via conductors 51 in the first row L1 are at positions different from the positions of the second via conductors 51 in the second row L2 in the direction of the row (in the direction along the axis D2). The positions herein are, for example, centroid positions. Thus, the distance d2 between the second via conductor 51 in the first row L1 and the second via conductor 51 in the second row L2 is longer than the distance d3 between the first and second rows L1 and L2.

Structure of Second Via Conductor

Figure 5B:
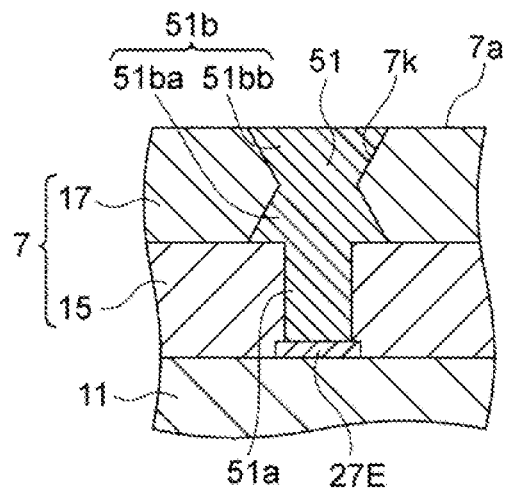
FIG. 5B is an enlarged view of an area Vb in FIG. 5A.

FIG. 5B is an enlarged view of an area Vb in FIG. 5A. FIG. 5B does not show a portion above the cover 7.

The second via conductor 51 extends throughout the cover 7 from the upper surface 11a of the piezoelectric substrate 11 to the upper surface 7a of the cover 7. The second via conductor 51 includes, for example, a lower portion 51a, which extends through the frame 15, and an upper portion 51b, which extends through the lid 17. The lower and upper portions 51a and 51b have, for example, a circular cross section taken orthogonal to the through-hole direction at any position in the through-hole direction. The lower and upper portions 51a and 51b have diameters of, for example, greater than or equal to 10 μm and smaller than 50 μm.

The lower portion 51a has, for example, a substantially uniform cross section (including the area) taken orthogonal to the through-hole direction. The upper portion 51b has a cross section taken orthogonal to the through-hole direction varying in, for example, the through-hole direction. More specifically, the upper portion 51b includes a first tapered portion 51ba having a smaller diameter toward the upper surface 7a of the cover 7, and a second tapered portion 51bb, which is located on the first tapered portion 51ba and having a larger diameter toward the upper surface 7a.

The first and second tapered portions 51ba and 51bb may have any length in the through-hole direction (any ratio of the lengths of the two portions in the lid 17). In the cross section parallel to the through-hole direction, the tapered surface (outer peripheral surface) may extend linearly, or may be curved outward or inward. The tapered surface may have any angle of inclination with respect to the through-hole direction. In the illustrated example, the first and second tapered portions 51ba and 51bb have substantially the same size and shape.

The lower and upper portions 51a and 51b may have any diameters. For example, the maximum diameter of the upper portion 51b (the diameter at the lower end of the first tapered portion 51ba and/or the diameter at the upper end of the second tapered portion 51bb) is greater than the diameter of the lower portion 51a. The diameter difference is, for example, 5 to 20 µm. The diameter of the lower portion 51a is, for example, substantially the same or slightly smaller than the minimum diameter of the upper portion 51b (between the first and second tapered portions 51ba and 51bb).

As described above, the first via conductors 47 (upper portions 47b) basically have a cylindrical shape. The first via conductors 47 (upper portions 47b) each have s a side surface shaped differently from a side surface of each via conductors 51 (upper portions 51b) at the cross section of the lid 17 orthogonal to the upper surface 11a of the piezoelectric substrate 11. More specifically, the first via conductors 47 are substantially linear, whereas the second via conductors 51 have a middle portion recessed inward.

The second via conductors 51 have a smaller diameter than the first via conductors 47. From another perspective, the through-holes 7k above the wires 27E have a smaller diameter than the through-holes 7h above the pads 25. For the second via conductors 51 having varying diameters in the through-hole direction and/or having a noncircular cross section taken orthogonal to the through-hole direction, the maximum diameter (the diameter at the lower or upper end of the upper portion 51b in the illustrated example) may be used as the diameter of the second via conductors 51 in the above comparison. For the first via conductors 47 having varying diameters in the through-hole direction and/or having a noncircular cross section taken orthogonal to the through-hole direction, the minimum diameter (the diameter at the lower portions 47a in the illustrated example) may be used as the diameter of the first via conductors 47. The diameter difference between the second and first via conductors 51 and 47 is, for example, at least 10 µm, at least 40 µm, or at least 50% of the diameter of the first via conductors 47.

The second via conductors 51 are formed from metal, such as Cu. The second via conductors 51 may be formed from multiple materials. For example, the second via conductors 51 may have the outer peripheral surface and the inside formed from different materials. The second via conductors 51 may be formed from the same material as the first via conductor 47. The second via conductors 51 may be formed from the same material as the reinforcement layer 9 to be integral with the reinforcement layer 9. In some embodiments, the second via conductors 51 may be formed from a material different from the material for the first via conductors 47 and/or the reinforcement layer 9.

Material and Thickness of Conductor Pattern on Piezoelectric Substrate

Figure 5C:
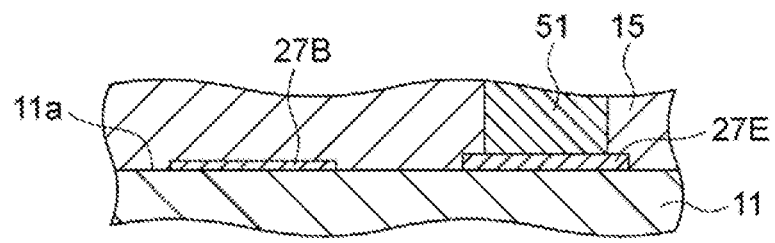
FIG. 5C is an enlarged view of an area Vc in FIG. 5A.

FIG. 5C is an enlarged view of an area Vc in FIG. 5A.

As shown in FIG. 5C, for example, the wires 27E underlying the second via conductors 51 are thicker than other wires 27 (27A to 27D). For example, the other wires 27 have a thickness of 50 to 600 nm, whereas the wires 27E have a thickness of 1 to 2 µm, or are thicker than the other wires 27 by 1 to 2 µm. The wires 27E may be thick throughout or only partially across the areas bonded to the second via conductors 51 and/or the surroundings of the area.

The IDT electrodes 29, the reflectors 31, and the wires 27 (excluding 27E) include, for example, a layered conductor (common conductor layer) formed from the same material and having substantially the same thickness. The common layered conductor is formed from, for example, Al or an alloy mainly containing Al (Al alloy). Examples of the Al alloy include an Al—Cu alloy. The common layered conductor may include multiple metal layers. The common layered conductor has a thickness of, for example, 50 to 600 nm. As described above, an additional coating may be provided over the common layered conductor for the IDT electrodes 29 and the reflectors 31.

The wires 27E are formed by, for example, placing another metal layer on the common layered conductor. Thus, the wires 27E are thicker than the other wires 27. Examples of the other metal layer include Au, Ni, and/or Cr. The wires 27E may be multilayer wires containing Ti and Al. The wires 27E may be thicker than the other wires 27 without including the common layered conductor.

The pads 25 may be formed from, for example, the common layered conductor alone, or another metal layer placed on the common layered conductor. Examples of the other metal layer include Au, Ni, and/or Cr. The other metal layer on the common layered conductor in each pad 25 may be formed from the same material or have the same thickness as the other metal layer on the common layered conductor for the wires 27E.

Electrical Isolation between Two Sections

As described above, the two sections 21 of the reinforcement layer 9 are not short-circuited (electrically isolated) in the SAW device 1, besides on the cover 7. More specifically, for example, the section 21A facing the SAW filter 23A is connected to only the terminals 3 (3A and 3E) and the second via conductors 51 (at positions P1 to P3), which are connected to the SAW filter 23A and not short-circuited from the SAW filter 23B. For example, the section 21B facing the SAW filter 23B is connected to only the terminals 3 (3B and 3D) and the second via conductors 51 (at positions P4 to P6), which are connected to the SAW filter 23B and not short-circuited from the SAW filter 23A.

Short-circuiting (excluding unintended short-circuiting) herein refers to connections achieved with, for example, conductors (such as the terminals 3, wires 27, and second via conductors 51) intended for achieving connections. From another perspective, short-circuiting refers to connections achieved without electronic devices (such as resistors, capacitors, inductors, or IDT electrodes 29). The conductors for achieving connections such as wires also have resistance, capacitance, and inductance, but they are not reflected herein.

Method for Manufacturing SAW Devices

Figure 6A:
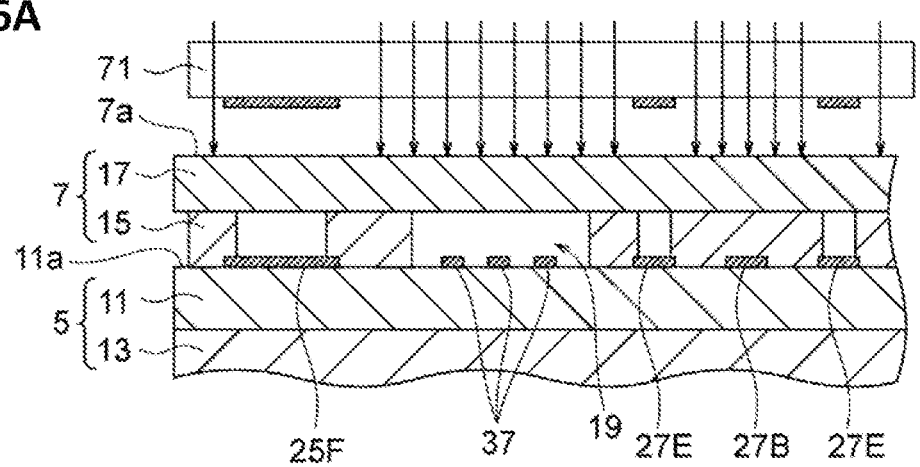
FIGS. 6A, 6B, and 6C are schematic cross-sectional views of the SAW device shown in FIG. 1 describing its example method of manufacture.
Figure 6B:
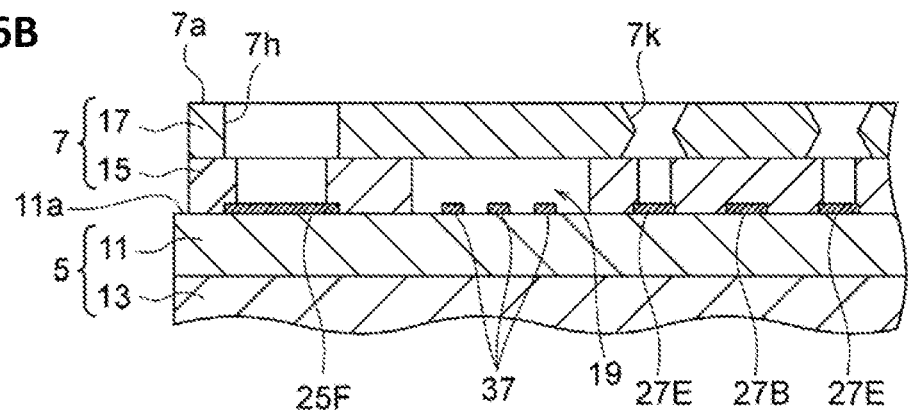
Figure 6C:
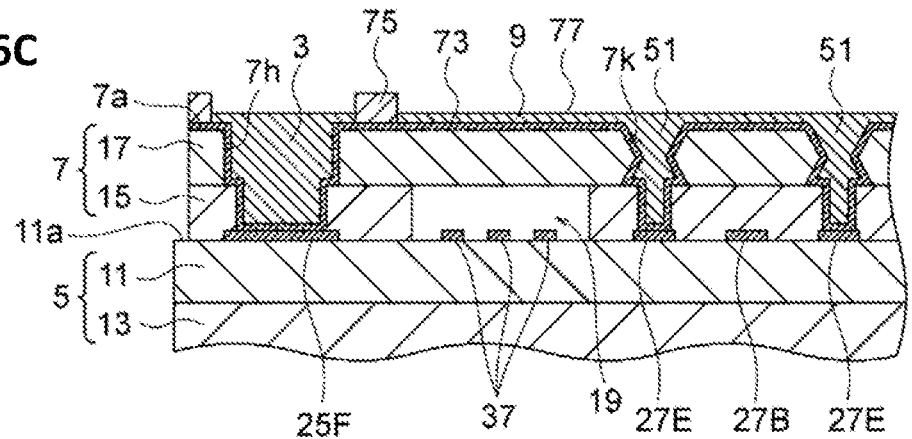

FIGS. 6A to 6C describe an example method for manufacturing the SAW device 1. FIGS. 6A to 6C are cross-sectional views corresponding to FIG. 5A. The manufacturing processes proceed from FIGS. 6A to 6C. Throughout FIGS. 6A to 6C, components are given the same reference numerals before and after the shapes or other properties change as the processes proceed.

The processes described below are performed using, for example, wafer processes. More specifically, a mother substrate to form the substrates 5 through splitting undergoes thin film fabrication or photolithography, and then is diced to collectively form multiple SAW devices 1.

As shown in FIG. 6A, a conductor pattern (including the IDT electrodes 29, the reflectors 31, the wires 27, and the pads 25) is first formed on the piezoelectric substrate 11. The frame 15 is then formed, and a resin layer to be a lid 17 is then formed on the frame 15. The resin layer is patterned by photolithography.

The conductor pattern may be formed on the piezoelectric substrate 11 by a known process. The frame 15 is formed by, for example, forming a thin film from a photoresist and removing part of the thin film by photolithography. The removed part of the thin film defines the spaces 19 and the lower portions of the through-holes 7h and 7k in the frame 15. Photolithography may be performed with a positive or negative photoresist.

The resin layer to be the lid 17 is formed by, for example, bonding a film of a photoresist on the frame 15. For example, a negative photoresist is used. In photolithography, for example, the resin layer to be the lid 17 is irradiated with light through a photomask 71, as indicated with an arrow. In photolithography with a negative photoresist, an area of the resin layer to remain and be the lid 17 (area other than the through-holes 7h and 7k) is irradiated with light.

As shown in FIG. 6B, portions of the through-holes 7h and 7k are defined in the lid 17 after photolithography. A portion of each through-hole 7k in the lid 17 has the shape corresponding to the shapes of the first and second tapered portions 51ba and 51bb. More specifically, each through-hole 7k in the lid 17 has a gradually decreasing diameter and then a gradually increasing diameter from the frame 15 toward the upper surface 7a of the cover 7. Each through-hole 7h in the lid 17 has a substantially uniform cross section taken orthogonal to the through-hole direction.

The through-hole 7k has a smaller diameter than the through-hole 7h. These through-holes 7k and 7h can be concurrently formed into different shapes. More specifically, although light is ideally assumed to propagate linearly parallel to the direction in which the photomask 71 and the lid 17 face each other, the light is actually scattered and/or diffracted. The outer edge of a lightproof portion of the photomask 71 corresponding to the through-hole 7k has a relatively large curvature, with which light entering from the outer edge of the lightproof portion is more likely to be superimposed. On the upper surface of the lid 17, light thus obliquely enters from the outer edge to define the through-hole 7k having a smaller diameter downward. On the lower surface of the lid 17, light may scatter or may undergo other phenomena to cause less light to reach more downward to define the through-hole 7k having a larger diameter downward. The relative positions of the cover 7, the photomask 71, and a lens system and/or the structure of the lens system are adjusted as appropriate to allow only the through-hole 7k to have two such tapered portions.

In the illustrated example, the through-hole 7h is substantially cylindrical. As described above, the through-hole 7h may be flared to have a larger diameter downward. Although the through-holes 7h and 7k are formed concurrently as described above, the through-holes 7h and 7k may be formed separately. In that case, the through-holes 7h and 7k may be formed to, for example, scatter light by different degrees, and thus may be easily formed in different shapes in a side view.

After the lid 17 is formed, as shown in FIG. 6C, the base layer 73 is formed on the cover 7 using metal, a resist mask 75 is placed on the base layer 73, and the base layer 73 is electroplated to allow metal 77 to deposit on the uncovered portion of the base layer 73.

More specifically, for example, the base layer 73 is formed in the through-holes 7h and 7k besides over the entire upper surface 7a of the cover 7 to extend over the pads 25 and the wires 27E. The resist mask 75 is placed on the upper surface 7a of the cover 7 at a position at which the conductive layer 10 (the reinforcement layer 9 and the land 49) is not to be placed. The metal 77 is then deposited on the upper surface 7a at the position at which the resist mask 75 is not placed, and in the through-holes 7h and 7k. Thus, the reinforcement layer 9, the terminals 3, and the second via conductors 51 are formed integrally.

Subsequently, the resist mask 75 and the portion of the base layer 73 immediately below the resist mask 75 are removed, although this is not shown. Unlike in the illustrated example, the base layer 73 may be formed after the resist mask 75 is formed, and the metal 77 may then be deposited.

As described above in the present embodiment, the SAW device 1 includes the piezoelectric substrate 11, the IDT electrodes 29 located on the upper surface 11a of the piezoelectric substrate 11, the cover 7 covering the upper surface 11a of the piezoelectric substrate 11 from above the IDT electrodes 29, at least one first via conductor 47 extending through at least part of the cover 7 from the upper surface 11a of the piezoelectric substrate 11 to the upper surface 7a of the cover 7, at least one second via conductor 51 located, on the piezoelectric substrate 11, inward from the first via conductor 47 in a plan view, the second via conductor 51 extending through at least part of the cover 7 from the upper surface 11a of the piezoelectric substrate 11 to the upper surface 7a of the cover 7 and having a smaller diameter than the first via conductor 47, and a conductive layer 10 (reinforcement layer 9) located on the upper surface 7a of the cover 7 extending over the upper end of the second via conductor 51.

Thus, the conductive layer 10 can more easily be flat than when, for example, the second and first via conductors 51 and 47 have the same diameter (or the second via conductors 51 have a relatively large diameter).

FIGS. 7A to 7D are cross-sectional views describing the above advantageous effects.

Figure 7A:
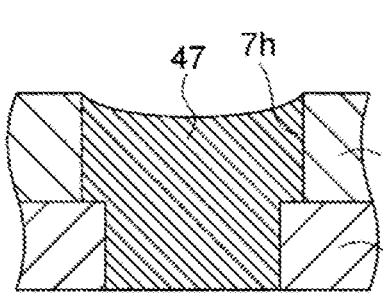
FIGS. 7A, 7B, 7C, and 7D are cross-sectional views of the SAW device shown in FIG. 1 describing its example effects.
Figure 7B:
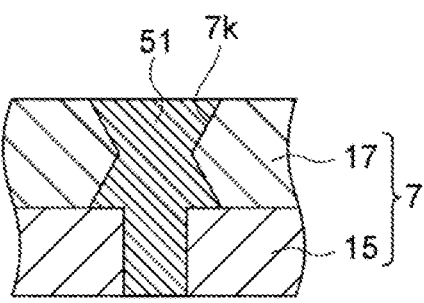

As shown in FIG. 7A, the first via conductor 47 formed by filling the through-hole 7h having a relatively large diameter with metal is likely to have a recessed upper surface. As shown in FIG. 7B, the second via conductor 51 formed by filling the through-hole 7k having a relatively smaller diameter with metal is less likely to have a recessed upper surface (more likely to have a flat upper surface).

Figure 7C:
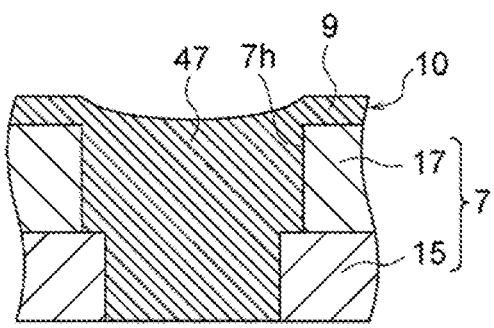
Figure 7D:
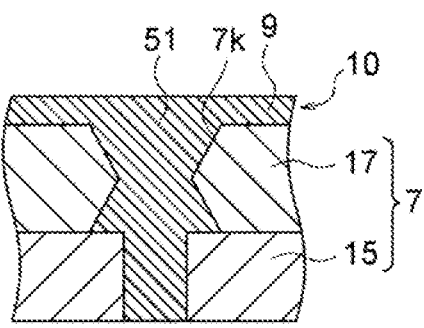

Thus, as shown in FIG. 7C, the conductive layer 10 is more likely to have the first via conductor 47 with a recessed surface. As shown in FIG. 7D, the conductive layer 10 is less likely to have the second via conductor 51 with a recessed surface (or more likely to have the conductor 51 with a flat surface).

As described with reference to FIG. 6C, this difference can result from, for example, the longer time taken to fill the through-hole having a relatively large diameter with metal to allow metal to deposit on the base layer formed on the inner surface of the through-hole.

The second via conductors 51 described above can improve the reliability of the SAW device 1.

More specifically, for example, the second via conductors 51 are located inward from the first via conductors 47 in a plan view. Thus, the conductive layer 10 (reinforcement layer 9) can have a flat inner area. This structure allows, for example, the SAW device 1 to be picked up with vacuum suction from the upper surface of the reinforcement layer 9. In other words, the SAW device 1 can be handled easily.

The reinforcement layer 9 that is more likely to be flat can have, for example, more second via conductors 51. In this case, the reinforcement layer 9 is less likely to separate from the upper surface of the cover 7.

More specifically, the second via conductors 51 having a smaller diameter than the first via conductors 47 are located inward. In the area including the second via conductors 51, the structure above the second via conductors 51 can be flat. This structure thus reduce defects resulting from, for example, stress concentration likely around irregular surfaces or separation or breaks around non-flat surfaces. The SAW device 1 is thus high reliable.

The diameter and the number of second via conductors 51 may be selected as appropriate to adjust thermal stress in the piezoelectric substrate 11. The components or materials stacked on the piezoelectric substrate 11 include, in the order of smaller coefficients of thermal expansion, the support substrate 13, the piezoelectric substrate 11, Cu (the first via conductors 47, the second via conductors 51, and the conductive layer 10), and a photoresist (cover 7). As the temperature rises, the cover 7 can expand to apply a tensile force to the piezoelectric substrate 11. The piezoelectric substrate 11 having an appropriate number of second via conductors 51 with an appropriate diameter can reduce this tensile force to a certain degree. This structure reduces the likelihood that the characteristics of the SAW device 1 deteriorate due to temperature changes.

The first via conductors 47 having a relatively large diameter arranged outward in the piezoelectric substrate can improve, for example, the strength of the SAW device 1. This structure reduces, for example, the likelihood that the first via conductors 47 can separate from the piezoelectric substrate 11 under an external force or thermal stress, and also reduces the likelihood that the cover 7 and the reinforcement layer 9 fixed by the first via conductors 47 are separated from each other or deform.

In the present embodiment, the shortest distance d2 between the second via conductors 51 is shorter than the shortest distance d1 between the first via conductors 47.

Thus, for example, the second via conductors 51 are arranged relatively densely to further reduce separation of the reinforcement layer 9. For example, the second via conductors 51 for the via conductors spaced from each other by a shorter distance, in place of the first via conductors 47, can effectively reduce any irregularities on the reinforcement layer 9.

In the present embodiment, the cover 7 includes the lid 17 formed from a single material. The first and second via conductors 47 and 51 have different shapes in a side cross-sectional view in the lid 17 taken orthogonal to the upper surface 11a of the piezoelectric substrate 11.

In this case, the first and second via conductors 47 and 51 can produce different advantageous effects. For example, the second via conductors 51 having more irregularities on the side surfaces than the first via conductors 47 can have higher resistance when withdrawn from the cover 7, and thus more effectively reduce separation of the reinforcement layer 9. The first via conductors 47 having less irregularities on the side surfaces can reduce stress concentration at the outer periphery of the cover 7 that is more likely to receive a relatively large external force or thermal stress.

In the present embodiment, the cover 7 includes the lid 17 formed from a single material. The first via conductor 47 has a side surface shaped differently from a side surface of the second via conductor 51 at a cross section of the lid 17 orthogonal to the upper surface 11a of the piezoelectric substrate 11.

This structure allows, for example, the second via conductor 51 to have higher resistance against withdrawal from the lid 17, and thus more effectively reduces separation of the reinforcement layer 9. The frame 15 is shaped uniformly in the thickness direction, and thus can receive the second via conductors 51 densely arranged within a narrow area. This structure thus does not upsize the SAW device 1. As described with reference to, for example, FIG. 6B, the second via conductors 51 having a relatively small diameter can easily have two such tapered portions.

In the present embodiment, the second via conductors include a first row L1 of two or more second via conductors 51 arranged in the direction along the axis D2 in a plan view, and a second row L2 of two or more second via conductors 51 arranged in the direction along the axis D2 in a plan view, and the second via conductors 51 in the first row L1 are arranged at positions different from the second via conductors 51 in the second row L2 in the direction along the axis D2.

Thus, for example, the second via conductors 51 are dispersed relatively unevenly. This structure more evenly reduces separation of the reinforcement layer 9 in the surface direction of the reinforcement layer 9. This structure includes the second via conductors 51 arranged at the distance d2 longer than the distance d3 between the first and second rows L1 and L2, and thus reduces, for example, irregularities on the reinforcement layer 9.

In the present embodiment, three or more IDT electrodes 29 are arranged in the SAW propagation direction to form the multimode SAW filters 23. The wires 27E, 27B, and 27E, which extend from the IDT electrodes 29B, 29C, and 29D in the same direction (negative D1 direction) intersecting with the SAW propagation direction, are arranged on the piezoelectric substrate 11. The second via conductors 51 include the two second via conductors 51 on the two wires 27E. The reinforcement layer 9 connects the two second via conductors 51 together.

More specifically, the second via conductors 51 and the reinforcement layer 9 form three-dimensional wiring connected to the multimode SAW filters 23. This structure facilitates the design of, for example, the number and the orientations of the IDT electrodes 29 in the multimode SAW filters 23. This structure also simplifies the manufacturing processes compared with when, for example, three-dimensional wiring is achieved by placing, between the piezoelectric substrate 11 and the cover 7, a wire overlapping the wire 27B that extends from the IDT electrode 29C via an insulating layer. This structure enables the design of, for example, the width, thickness, and material of the wire 27B without considering the three-dimensional wiring placed via an insulating layer, and thus can have the wire 27B with a larger thickness or with an appropriate material selected to reduce the resistance of the wire 27B. A wire overlapping the wire 27B with an insulating layer between the wires can have a step on the edge of the wire 27B, at which the insulating layer can expand and crack. This structure also reduce the likelihood that the wire 27B can have such a step.

In the present embodiment, the IDT electrodes 29 located on the piezoelectric substrate 11 form the multimode SAW filters 23A and 23B. The second via conductors 51 include at least one second via conductors 51 (at positions P2 and P3) located between the SAW filters 23A and 23B in a plan view and connected to the SAW filter 23A among the SAW filters 23A and 23B, and at least one second via conductors 51 (at positions P5 and P6) located between the SAW filters 23A and 23B in a plan view and connected to the SAW filter 23B among the SAW filters 23A and 23B. The reinforcement layer 9 includes the section 21A facing the SAW filter 23A among the SAW filters 23A and 23B, and the section 21B facing only the SAW filter 23B among the SAW filters 23A and 23B. The second via conductors 51 at the positions P2 and P3 are connected to the section 21A among the sections 21A and 21B, and the second via conductors 51 at the positions P5 and P6 are connected to the section 21B among the sections 21A and 21B.

More specifically, the second via conductors 51 at the positions P2, P3, P5, and P6 are located between the SAW filters 23A and 23B and connected to the different sections 21A and 21B, and thus the sections 21A and 21B facing the SAW filters 23A and 23B are electrically separated from each other (not short-circuited). This structure improves the isolation between the SAW filters 23A and 23B, and thus improves the entire filter characteristics of the SAW device 1. For example, the second via conductors 51 at the positions P2, P3, P5, and P6 also function as shields that three-dimensionally shield the SAW filters 23A and 23B.

In the present embodiment, the wires 27E underlying the second via conductors 51 are thicker than the wires 27B not underlying the second via conductors 51.

This reduces, for example, the likelihood that the wires 27E separate from the piezoelectric substrate 11 or break under a force applied from the second via conductors 51. From another perspective, the second via conductors 51 are more firmly fixed to the piezoelectric substrate 11. This structure thus reduces the likelihood that the reinforcement layer 9 can separate.

As shown in FIG. 5A, the SAW device 1 may further include an insulating layer 43 covering the reinforcement layer 9. The insulating layer 43 is located over the second via conductors 51 without being located over the first via conductors 47. More specifically, the first via conductors 47 form the terminals 3, whereas the second via conductors 51 do not form the terminals.

The insulating layer 43 can have, for example, an irregular upper surface following the irregular surface of the reinforcement layer 9. The insulating layer 43 can thus have a flat upper surface following the flatness described with reference to FIGS. 7A to 7D. The first via conductors 47 included in the terminals 3 are not intended to be flat in many cases. Thus, the first via conductors 47 having a relatively large diameter and the second via conductors 51 having a relatively small diameter increase the bonding area for the bumps 45 while achieving the flatness of the reinforcement layer 9.

In the above embodiment, the IDT electrodes 29 are examples of excitation electrodes. The conductive layer 10 or the reinforcement layer 9 is an example of a conductive layer. The lid 17 is an example of a resin layer. The direction along the axis D2 is an example of a predetermined direction. The IDT electrodes 29B to 29D are examples of first to third IDT electrodes. The wires 27E (including the wire at the position P2), the wires 27B (wires between the positions P2 and P3), and the wires 27E (including the wire at position P3) connected to these electrodes are examples of first to third wires. The SAW filters 23A and 23B are examples of first and second filters. The second via conductor 51 at the position P2 is an example of the third via conductor, and the second via conductor 51 at the position P5 is an example of the fourth via conductor.

Modification

A SAW device according to a modification will now be described with reference to FIGS. 8A to 8C. The modification will be basically described focusing on its differences from the embodiment. Unless otherwise specified, the structure in the modification is the same as in the embodiment. The same or similar components as in the embodiment are given the same reference numerals as in the embodiment.

Figure 8A:
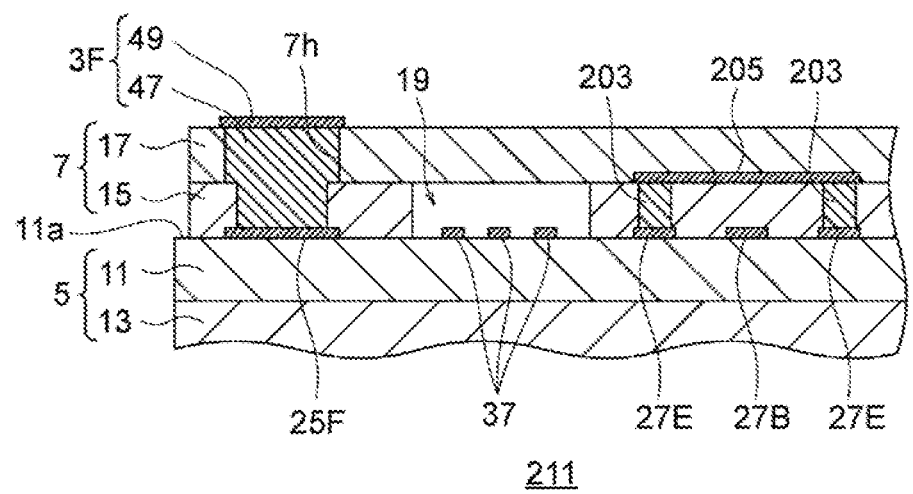
FIGS. 8A, 8B, and 8C are cross-sectional views of SAW devices according to modifications.

FIG. 8A is a cross-sectional view of a SAW device 201 according to the modification, corresponding to FIG. 5A.

The SAW device 201 includes second via conductors 203, corresponding to the second via conductors 51 according to the embodiment, extending through only the frame 15 of the cover 7 (includes only the lower portion 51a according to the embodiment from another perspective). The second via conductors 203 are connected together via an intermediate layer 205, which is a conductive layer arranged between the frame 15 and the lid 17. Although not shown, the intermediate layer 205 is connected to the terminals 3 that receive a reference potential. In this manner, the conductive layer covering the upper end of the second via conductor 203 may be located in the cover 7, instead of being located on the cover 7.

The SAW device 201 is manufactured with substantially the same method as for the SAW device 1, except, for example, that the lower portions 47a of the first via conductors 47 and second via conductors 203 are formed after the frame 15 is formed and before a photoresist layer to be the lid 17 is formed, and the intermediate layer 205 is formed concurrently. These may be formed by, for example, forming the base layer 73 and depositing the metal 77, as in the above embodiment. The intermediate layer 205 may be formed from the base layer 73 alone.

In the illustrated example, the SAW device 201 does not include the reinforcement layer 9, but may include the reinforcement layer 9 as in the above embodiment.

In this modification as well, the second via conductors 203 have a smaller diameter than the first via conductors 47 to produce the advantageous effects. For example, the intermediate layer 205, which is less likely to be recessed, is expected to be in tighter contact with the lid 17. In addition, for example, the diameter and the number of second via conductors 203 may be selected as appropriate to adjust thermal stress that can occur in the piezoelectric substrate 11.

Figure 8B:
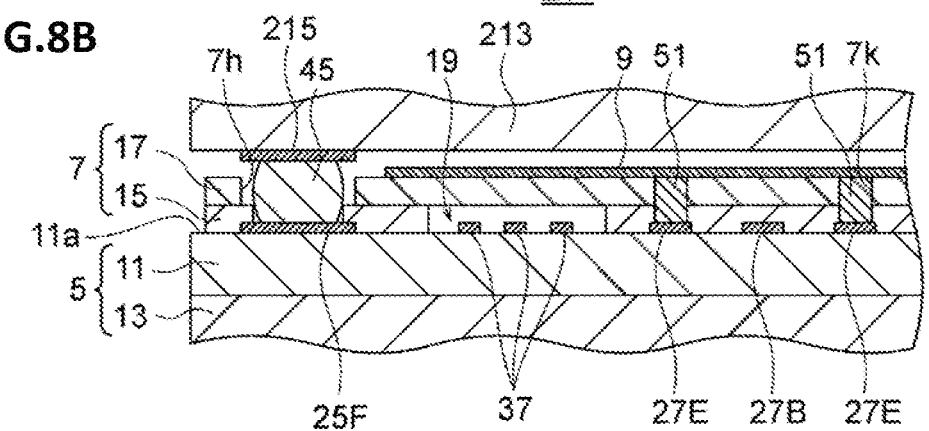

FIG. 8B is a cross-sectional view of a SAW device 211 according to a modification, corresponding to FIG. 5A.

The SAW device 211 includes no first via conductor 47 (terminal 3) in the through-hole 7h, and instead includes the bump 45 in the through-hole 7h. The bump 45 bonds the pad 25 and a pad 215 on a circuit board 213 on which the SAW device 211 is mounted. The bump 45 may be placed on the pad 25 and then bonded to the pad 215, or placed on the pad 215 and then bonded to the pad 25.

In this modification as well, the second via conductors 51 have a smaller diameter than the through-hole 7h to produce the advantageous effects. For example, this structure allows the reinforcement layer 9 to be flat and to be less likely to separate.

Figure 8C:
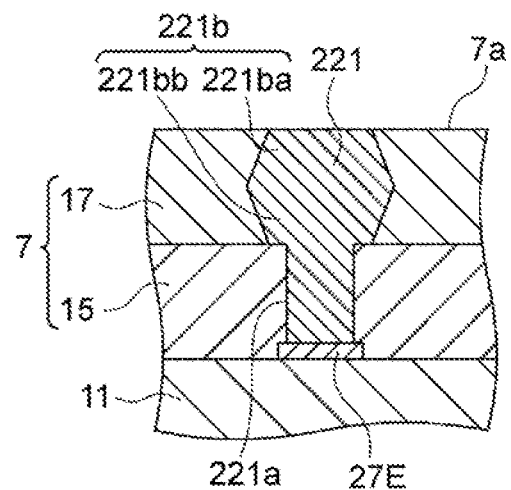

FIG. 8C is a cross-sectional view of a second via conductor 221 according to a modification, corresponding to FIG. 5C.

The second via conductor 221 includes a lower portion 221a, which extends through the frame 15, and an upper portion 221b, which extends through the lid 17. The lower portion 221a has the same shape as the lower portion 51a according to the embodiment. The upper portion 221b has a shape tapered in the direction opposite to the upper portion 51b according to the embodiment. More specifically, the upper portion 221b includes a second tapered portion 221bb having a larger diameter upward, and a first tapered portion 221ba, which is arranged on the second tapered portion 221bb and having a smaller diameter upward. The second via conductor 221 with this shape is formed using, for example, a positive photoresist in place of a negative photoresist for forming the lid 17.

Application Example

Duplexer

Figure 9:
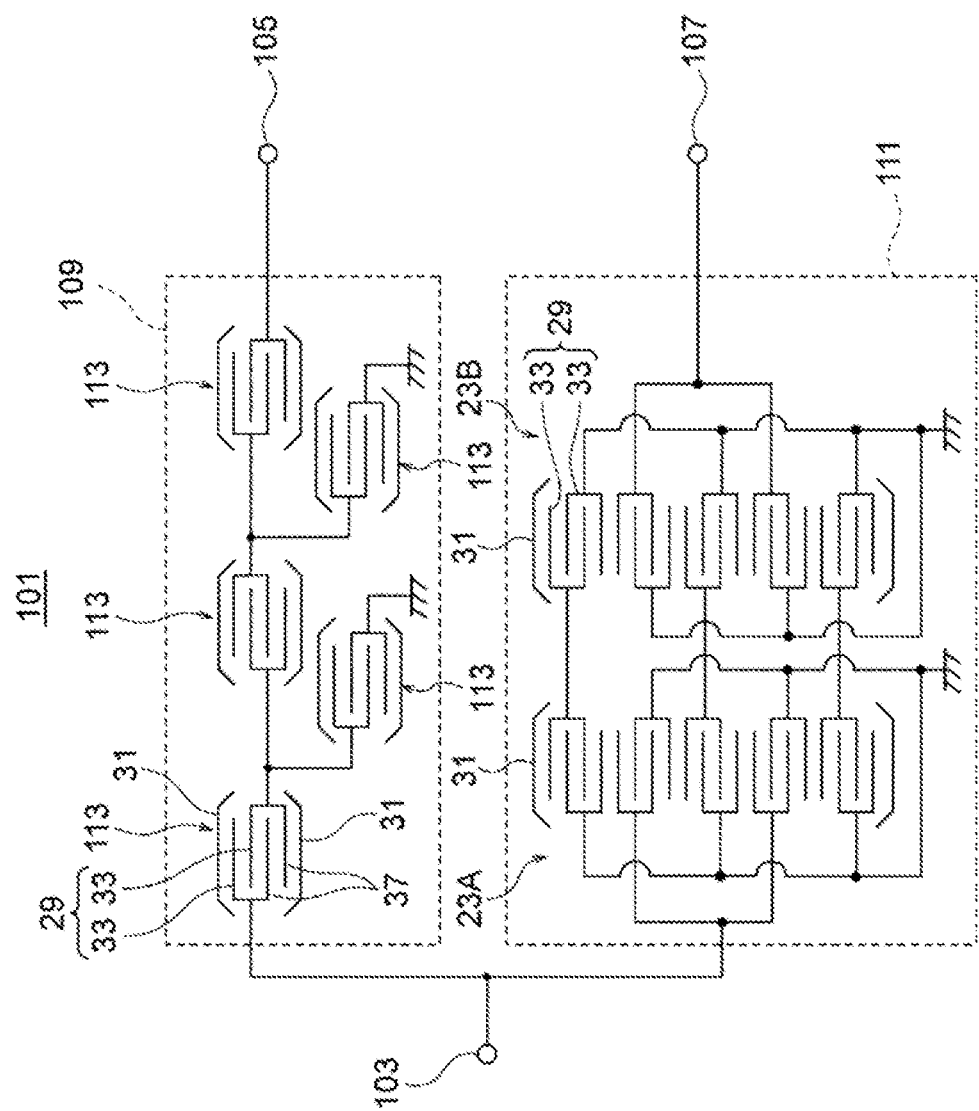
FIG. 9 is a circuit diagram of a duplexer as an application example of the SAW device shown in FIG. 1.

FIG. 9 is a circuit diagram schematically showing the structure of a duplexer 101 as an application example of the SAW device 1. As indicated by the reference numerals in the upper left part of FIG. 9, interdigital electrodes 33 are bifurcated as schematically shown in the figure.

The duplexer 101 includes, for example, a transmission filter 109, which filters signals transmitted from a transmission terminal 105 and outputs the filtered signals to an antenna terminal 103, and a reception filter 111, which filters signals received from the antenna terminal 103 and outputs the filtered signals to a reception terminal 107.

The transmission filter 109 is, for example, a ladder SAW resonator filter including multiple SAW resonators 113 connected in a ladder. The SAW resonators 113 are, for example, one-port SAW resonators, including one IDT electrode 29 and a pair of reflectors 31, arranged on both sides of the IDT electrode 29 in the propagation direction of SAWs.

The reception filter 111 is formed by, for example, the SAW device 1. The antenna terminal 103 is formed by the terminal 3F or a terminal connected to the terminal 3F. The reception terminal 107 is formed by the terminal 3C or a terminal connected to the terminal 3C.

Although the SAW device 1 forms the reception filter 111 in the present embodiment, the SAW device 1 may also form a transmission filter 109 in place of or in addition to the reception filter 111.

The transmission filter 109 and the reception filter 111 may be arranged on the same piezoelectric substrate 11, or may be arranged on different piezoelectric substrates 11, mounted on a common circuit board and connected to each other.

Communication Device

Figure 10:
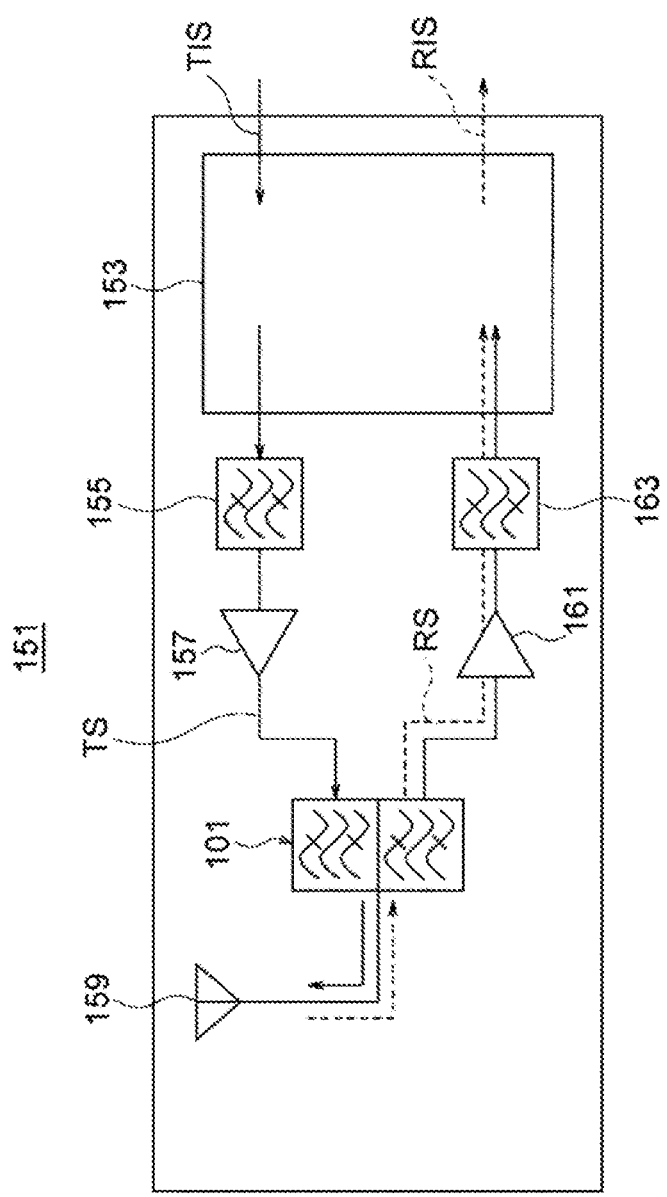
FIG. 10 is a block diagram of a communication device as an application example of the SAW device shown in FIG. 1.

FIG. 10 is a block diagram of a main portion of a communication device 151, which is an application example of the SAW device 1 (duplexer 101). The communication device 151 performs wireless communication using radio waves. The communication device 151 includes the duplexer 101.

The communication device 151 includes a radio frequency integrated circuit (RF-IC) 153 that modulates and raises the frequency of transmission information signals TIS including information to be transmitted, into transmission signals TS (converts the signals to high frequency signals with a carrier wave frequency). A band-pass filter 155 removes, from the transmission signals TS, unintended components for the passband other than the transmission passband. An amplifier 157 amplifies the transmission signals TS, and inputs the transmission signals TS to the duplexer 101 (transmission terminal 105). The duplexer 101 then removes unintended components for the passband other than the transmission passband from the input transmission signals TS, and outputs the resultant transmission signal TS from the antenna terminal 103 to an antenna 159. The antenna 159 converts input electric signals (transmission signals TS) into radio signals (radio waves) and transmits the signals.

In the communication device 151, the antenna 159 receives the radio signals (radio waves), converts the signals into electric signals (reception signals RS), and inputs the signals into the duplexer 101 (antenna terminal 103). The duplexer 101 removes unintended components for the passband other than the transmission passband from the input reception signals RS and outputs the signals to an amplifier 161. The amplifier 161 amplifies the output, reception signals RS, and a band-pass filter 163 removes unintended components for the passband other than the transmission passband from the signals. The RF-IC 153 lowers the frequency of the reception signals RS and modulates the signals to be converted into reception information signals RIS.

The transmission information signals TIS and the reception information signals RIS may be low-frequency signals (baseband signals) including appropriate information, or may for example be analog or digital audio signals. A radio signal passband may be a passband defined by any standard. The modulation may be phase modulation, amplitude modulation, frequency modulation, or a combination of two or more of these methods of modulation. Although FIG. 10 shows a direct conversion circuit by way of example, the circuit may be another circuit, for example, a double superheterodyne circuit. FIG. 10 schematically shows only the main portion. The circuit may also include a low-pass filter or an isolator at an appropriate position, or may have components including the amplifier at positions different from the illustrated example.

The present invention may be embodied in various other aspects besides the above embodiments and modifications. The embodiments and modifications may be combined together as appropriate.

The elastic wave device is not limited to a SAW device. For example, the elastic wave device may be a bulk acoustic wave (BAW) device, a device including a thin-film bulk acoustic resonator, or an elastic boundary wave (this may be regarded as a type of SAW) device. For an elastic wave device including a filter, the filter may be other than a multimodefilter. For example, the filter may be a ladder filter described with reference to FIG. 9.

The upper and lower portions of the first via conductor and/or the lower portion of the second via conductor may have a cross section having a smaller diameter or having a larger diameter toward the upper surface of the cover, or a cross section including two tapered portions as in the upper portion of the second via conductor, in place of the cross section uniform (for example, cylindrical) in the through-hole direction. In contrast, the upper portion of the second via conductor may have a cross section that is uniform (for example, cylindrical) in the through-hole direction, or a cross section that has a single tapered portion.

The first via conductors may extend through, for example, only the frame or only the lid, instead of extending through the entire cover. The second via conductors may extend through, for example, only the lid, instead of extending through the entire cover or through only the frame.

In the above embodiment, the second via conductors and the conductive layer (reinforcement layer) receive a reference potential. However, the second via conductors and the conductive layer may receive input or output signals.

The cover is not limited to the cover including two layers. For example, the cover may include three or more layers. The entire cover may be integrally formed by forming a resin layer to cover a sacrificial layer to be a space, and then removing the sacrificial layer. The above elastic boundary wave device may exclude a space above the excitation electrode and may include a cover formed from a single layer.

As in the modification described with reference to FIG. 8A, the conductive layer connected to the upper end of the second via conductor may be provided for any purpose other than reinforcement of the lid. Similarly, the conductive layer located on the upper surface of the cover may be provided for other purposes. The second via conductors may be arranged at positions other than where three-dimensional wiring is to be formed.

The cover 7 covers the upper surface of the substrate 5. The frame of the cover may not be bonded to only the upper surface of the piezoelectric substrate 11 as in the above embodiment. For the support substrate 13 having a larger planar shape than the piezoelectric substrate 11, for example, the upper surface of the substrate 5 may include an upper surface of the support substrate uncovered from the piezoelectric substrate. In this structure, the frame 15 may include an area overlapping the support substrate 13.

Similarly, this structure may include a terminal 3 on the upper surface of the support substrate 13 uncovered from the piezoelectric substrate. More specifically, the first via conductor forming the terminal 3 may be arranged on the support substrate, and the second via conductor may be arranged on the piezoelectric substrate. For a thin piezoelectric substrate, a first via conductor having a large area may be arranged on a thick support substrate to be firmly bonded to the thin piezoelectric substrate. The separate piezoelectric substrate can reduce cracks or other defects. Further, the smaller area of the second via conductor that comes into contact with the piezoelectric substrate can reduce stress applied to the thin piezoelectric substrate.

REFERENCE SIGNS LIST

1 SAW device (elastic wave device)
7 cover
9 reinforcement layer (conductive layer)
11 piezoelectric substrate
29 IDT electrode (excitation electrode)
47 first via conductor
51 second via conductor

The invention claimed is:

1. An elastic wave device, comprising:
   a substrate comprising a piezoelectric substrate;
   at least one excitation electrode located on an upper surface of the piezoelectric substrate;
   a cover covering the upper surface of the piezoelectric substrate from above the at least one excitation electrode;
   at least one first via conductor extending through at least part of the cover from the upper surface of the piezoelectric substrate to an upper surface of the cover;
   at least one second via conductor located, on the piezoelectric substrate, inward from the at least one first via conductor in a plan view, the at least one second via conductor extending through at least part of the cover from the upper surface of the piezoelectric substrate to the upper surface of the cover, the at least one second via conductor having a smaller diameter than the at least one first via conductor; and
   a conductive layer located on the upper surface of the cover or in the cover, the conductive layer extending over an upper end of the at least one first via conductor and an upper end of the at least one second via conductor,
   wherein an upper surface of a portion of the conductive layer that extends over the upper end of the at least one first via conductor comprises a region lower than an upper surface of a portion of the conductive layer that extends over the upper end of at least one second via conductor.

2. The elastic wave device according to claim 1, wherein the conductive layer is on the upper surface of the cover.

3. The elastic wave device according to claim 2, wherein a shortest distance between a plurality of the second via conductors including the at least one second via is shorter than a shortest distance between a plurality of the first via conductors including the at least one first via.

4. The elastic wave device according to claim 1, wherein the cover comprises a resin layer comprising a single material, and
the at least one first via conductor has a side surface shaped differently from a side surface of the at least one second via conductor at a cross section of the resin layer orthogonal to the upper surface of the piezoelectric substrate.

5. The elastic wave device according to claim 1, wherein the cover comprises a resin layer comprising a single material, and
the at least one second via conductor has a first tapered portion having a smaller diameter toward the upper surface of the cover, and a second tapered portion having a larger diameter toward the upper surface of the cover.

6. The elastic wave device according to claim 1, wherein the at least one second via conductor comprises, as a plurality of second via conductors, a first row of two or more second via conductors arranged in a predetermined direction in a plan view, and a second row of two or more second via conductors arranged in the predetermined direction in a plan view, and the second via conductors in the first row are arranged at positions different from the second via conductors in the second row in the predetermined direction.

7. The elastic wave device according to claim 1, wherein the at least one excitation electrode comprises, as a plurality of excitation electrodes, a first interdigital transducer electrode, a second interdigital transducer electrode, and a third interdigital transducer electrode located on the piezoelectric substrate configured to form a multimode filter,
the first interdigital transducer electrode, the second interdigital transducer electrode, and the third interdigital transducer electrode are arranged in a propagation direction of elastic waves in the stated order,
the elastic wave device further comprises a first wire, a second wire, and a third wire located on the substrate and extending from the first interdigital transducer electrode, the second interdigital transducer electrode, and the third interdigital transducer electrode in the same direction intersecting with the propagation direction,
the at least one second via conductor comprises, as a plurality of second via conductors, a second via conductor on the first wire and a second via conductor located on the third wire, and
the conductive layer connects the second via conductor located on the first wire and the second via conductor located on the third wire.

8. The elastic wave device according to claim 7, wherein the first wire and the third wire are thicker than the second wire.

9. The elastic wave device according to claim 1, wherein the at least one excitation electrode comprises, as a plurality of excitation electrode, a plurality of interdigital transducer electrodes on the piezoelectric substrate configured to form a multimode first filter and a multimode second filter, the at least one second via conductor comprises, as a plurality of second via conductors, at least one third via conductor located between the first filter and the second filter in a plan view and connected to the first filter among the first filter and the second filter, and at least one fourth via conductor located between the first filter and the second filter in a plan view and connected to the second filter among the first filter and the second filter, the conductive layer comprises a first section facing the first filter among the first filter and the second filter and a second section facing the second filter among the first filter and the second filter, the at least one third via conductor is connected to the first section among the first section and the second section, and the at least one fourth via conductor is connected to the second section among the first section and the second section.

10. The elastic wave device according to claim 1, wherein the conductive layer is on the upper surface of the cover, the elastic wave device further comprises an insulating layer covering the conductive layer, and the insulating layer is over the at least one second via conductor without being over the at least one first via conductor.

11. A duplexer, comprising:

a transmission filter connected to a terminal; and a reception filter connected to the terminal, wherein the transmission filter and/or the reception filter includes the elastic wave device according to claim 1.

12. A communication apparatus, comprising:

an antenna;

the elastic wave device according to claim 1 connected to the antenna; and an integrated circuit connected to the elastic wave device.

* * * * *